(12) United States Patent
Torii

(10) Patent No.: US 8,981,532 B2
(45) Date of Patent: Mar. 17, 2015

(54) SEMICONDUCTOR DEVICE AND MANUFACTURING METHOD THEREOF

(71) Applicant: Elpida Memory, Inc., Tokyo (JP)

(72) Inventor: Koji Torii, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/672,115

(22) Filed: Nov. 8, 2012

(65) Prior Publication Data

US 2013/0134548 A1   May 30, 2013

(30) Foreign Application Priority Data

Nov. 30, 2011  (JP) ................................. 2011-262946

(51) Int. Cl.
*H01L 23/48* (2006.01)
*H01L 21/683* (2006.01)
*H01L 21/768* (2006.01)
*H01L 23/31* (2006.01)
*H01L 23/00* (2006.01)

(52) U.S. Cl.
CPC ........... *H01L 23/481* (2013.01); *H01L 21/6835* (2013.01); *H01L 21/7682* (2013.01); *H01L 21/76898* (2013.01); *H01L 23/3135* (2013.01); *H01L 24/11* (2013.01); *H01L 24/13* (2013.01); *H01L 24/14* (2013.01); *H01L 2221/68327* (2013.01); *H01L 2221/6834* (2013.01); *H01L 2221/68372* (2013.01); *H01L 2224/05571* (2013.01); *H01L 2224/11002* (2013.01); *H01L 2224/1146* (2013.01); *H01L 2224/13021* (2013.01); *H01L 2224/13022* (2013.01); *H01L 2224/13023* (2013.01); *H01L 2224/13025* (2013.01); *H01L 2224/13082* (2013.01); *H01L 2224/131* (2013.01); *H01L 2224/13144* (2013.01); *H01L 2224/13147* (2013.01); *H01L 2224/14156* (2013.01); *H01L 2224/14181* (2013.01); *H01L 2224/16146* (2013.01); *H01L 2224/81193* (2013.01); *H01L 2924/00012* (2013.01); *H01L 2924/00014* (2013.01); *H01L 2924/014* (2013.01)
USPC ..... 257/621; 257/508; 257/774; 257/E23.011

(58) Field of Classification Search
USPC .......................... 257/508, 621, 774, E23.011
See application file for complete search history.

(56) References Cited

U.S. PATENT DOCUMENTS

| | | | | |
|---|---|---|---|---|
| 2012/0058605 | A1* | 3/2012 | Fujii | 438/118 |
| 2012/0061827 | A1* | 3/2012 | Fujita | 257/737 |
| 2012/0070918 | A1* | 3/2012 | Fujita | 438/17 |
| 2012/0261826 | A1* | 10/2012 | Kuo et al. | 257/774 |
| 2014/0264940 | A1* | 9/2014 | Byun et al. | 257/774 |

FOREIGN PATENT DOCUMENTS

| | | |
|---|---|---|
| JP | 2009-272490 | 11/2009 |
| JP | 2010-232400 | 10/2010 |

* cited by examiner

*Primary Examiner* — Victor A Mandala
(74) *Attorney, Agent, or Firm* — Young & Thompson

(57) ABSTRACT

In a semiconductor device, the thickness of an insulating film formed in a through hole is reduced, while an annular groove having an insulating material embedded therein is provided so as to ensure a sufficient total thickness of the insulator, whereby a through silicon via is provided with an insulating ring which is improved in both processability and functionality.

20 Claims, 28 Drawing Sheets

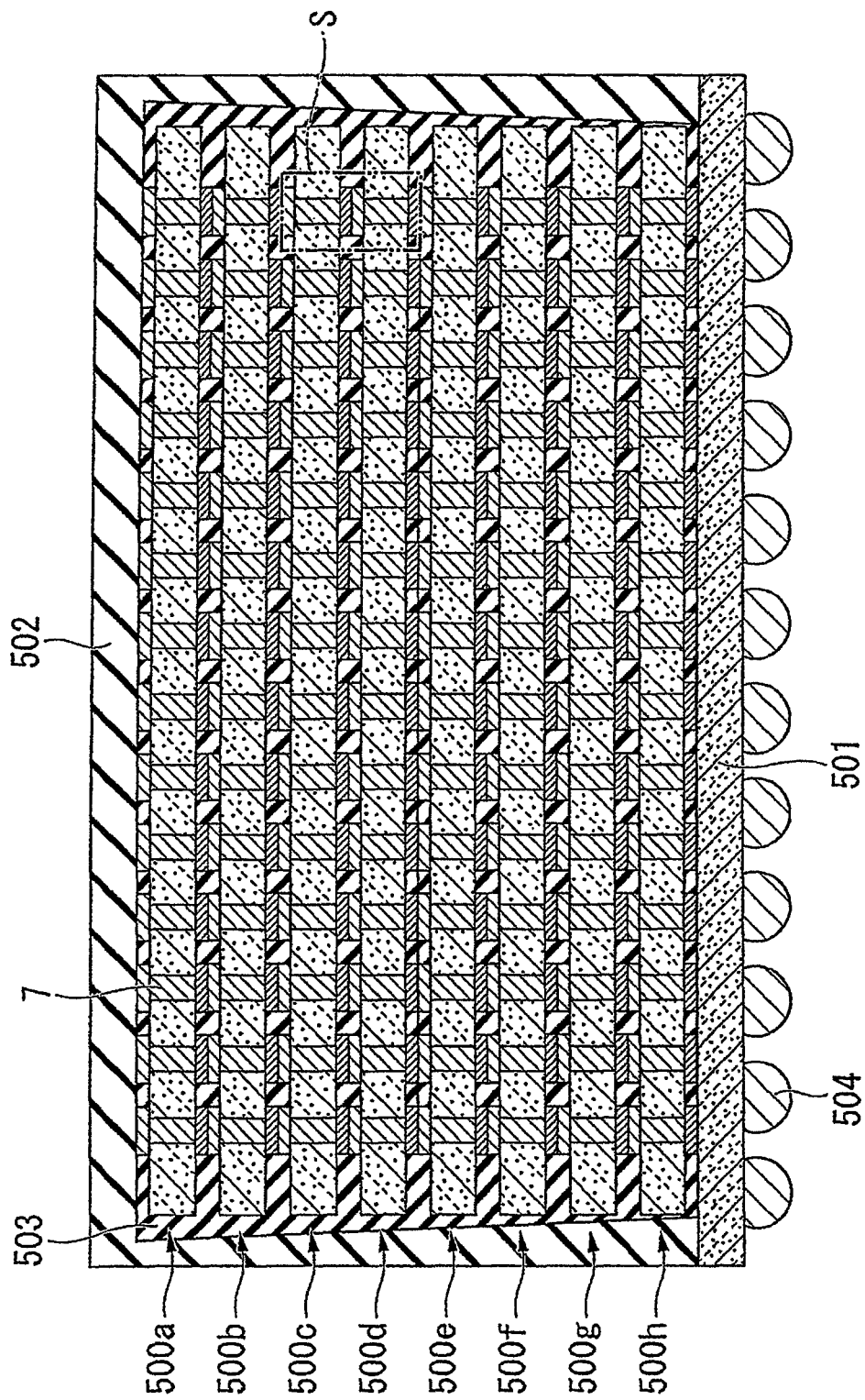

SEMICONDUCTOR DEVICE AND MANUFACTURING METHOD THEREOF

This application is based upon and claims the benefit of priority from Japanese Patent Application No. 2011-262946, filed on Nov. 30, 2011, the disclosure of which is incorporated herein in its entirety by reference.

BACKGROUND OF THE INVENTION

1. Field of the Invention

This invention relates to a semiconductor device and a manufacturing method thereof.

2. Description of the Related Art

In some known semiconductor devices having a plurality of semiconductor chips stacked to realize high functionality, a configuration is employed in which upper and lower semiconductor chips are electrically connected by way of through silicon vias (hereafter, abbreviated as "TSV") which are formed to penetrate through the semiconductor chips. In particular, a process (via-last process) is known in which circuit elements, wirings, surface electrodes and the like are formed on the major surface of a substrate and then through silicon vias are formed from the rear surface of the substrate.

In such a configuration or process, an annular insulating isolation portion (insulating ring) may be provided to surround each of the through silicon vias for the purposes of insulation between the through silicon via and an element region, reduction of parasitic capacity between the through silicon vias, and/or prevention of diffusion of a metal material forming the through silicon vias to the element region.

For example, Japanese Laid-Open Patent Publication No. 2010-232400 (Patent Document 1) discloses a process to realize a through silicon via having a structure in which a wiring penetrates through a substrate from one surface to the other by forming a circuit element and a first wiring layer on the top surface of a semiconductor substrate, then forming a through hole in the rear surface thereof, and forming a second wiring layer in the through hole after the inner wall of the through hole is covered with an insulating layer. An annular insulating ring surrounding the through silicon via is realized by covering the inner wall of the through silicon via with an insulating film before forming the second wiring layer (see FIG. 3 of Patent Document 1).

SUMMARY OF THE INVENTION

The inventor has studied about the through silicon vias having an insulating ring as described above and obtained findings as described below. When a second wiring layer is formed after the inner wall of a through hole is covered with an insulating layer as in the method disclosed in Patent Document 1, the insulating layer covering the bottom surface of the through hole must be removed before forming the second wiring layer. This is because the second wiring formed in the through hole must be in contact with the first wiring on the bottom surface of the through hole to realize a through silicon via penetrating through the substrate from the top surface to the rear surface. The insulating layer is removed by anisotropic etching (etched back), in order to remove only the insulating layer located on the bottom surface of the through hole while leaving the insulating layer for forming an insulating ring on the side wall of the through hole. During this process, the first wiring arranged under the insulating layer on the bottom surface of the through hole will be damaged by the anisotropic etching, possibly leading to increase of wiring resistance. From this view point, the thickness of the insulating layer to be removed by anisotropic etching should preferably be as thin as possible. On the other hand, the insulating ring is provided for the purposes of improving the insulating properties of the through silicon via, reducing the parasitic capacity, and/or preventing diffusion. In order to ensure theses effects, the thickness should preferably be as great as possible. The inventor thus found that processability and functionality of the insulating layer were in a trade-off relationship.

Japanese Laid-Open Patent Publication No. 2009-272490 (Patent Document 2) discloses a method in which an annular groove surrounding a through hole is formed in the same process as formation of a through hole in which a through silicon via is to be formed, whereby an insulating ring with the annular groove having a hollow structure is realized (see FIG. 5 of Patent Document 2). According to Patent Document 2, the hollow insulating ring provided outside the through hole eliminates the need of forming an insulating layer as described in Patent Document 1, and hence the processes of forming the insulating layer and processing the same can be omitted. Since the formation of the insulating layer is not required, the risk of etching damage on the bottom surface of the through hole as described above is eliminated. However, when the hollow insulating ring is formed without involving an insulating layer as in Patent Document 2, the insulating properties between the through silicon via and an element and the effect of reducing the parasitic capacity between the through silicon vias cannot be controlled but by width of the hollow insulating ring. Therefore, the technique of Patent Document 2 needs more improvement. Further, according to Patent Document 2, the through silicon via is directly in contact with the semiconductor substrate. In this configuration, it is difficult to prevent diffusion of a material of the through silicon via (e.g. copper) and more improvement is required in this respect.

An embodiment of the invention provides a semiconductor device including: a wiring layer formed over a first major surface of a substrate; a through hole penetrating a second major surface facing the first major surface of the substrate and reaching the wiring layer; an annular groove formed in an annular shape in the second major surface so as to surround the through hole; a first annular insulating portion including an insulating material embedded in the annular groove; a second annular insulating portion including an insulating film covering a side wall of the through hole; and a conductor filling an inside of the insulating film and being in contact with the wiring layer.

In the semiconductor device according to the invention, the thickness of the insulating film formed in the through hole is reduced to improve the processability, while an annular groove in which an insulating material is embedded is provided to ensure a sufficient thickness for an insulator as a whole, whereby the functionalities such as improved insulating properties of the through silicon via, reduced parasitic capacity, and/or of prevention of diffusion can be ensured.

BRIEF DESCRIPTION OF THE DRAWINGS

The above features and advantages of the present invention will be more apparent from the following description of certain preferred embodiments taken in conjunction with the accompanying drawings, in which:

FIG. 2A is a cross-sectional view showing the entirety of a stacked structure in which the semiconductor device shown in FIGS. 1A to 1C is stacked in plurality;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1A:
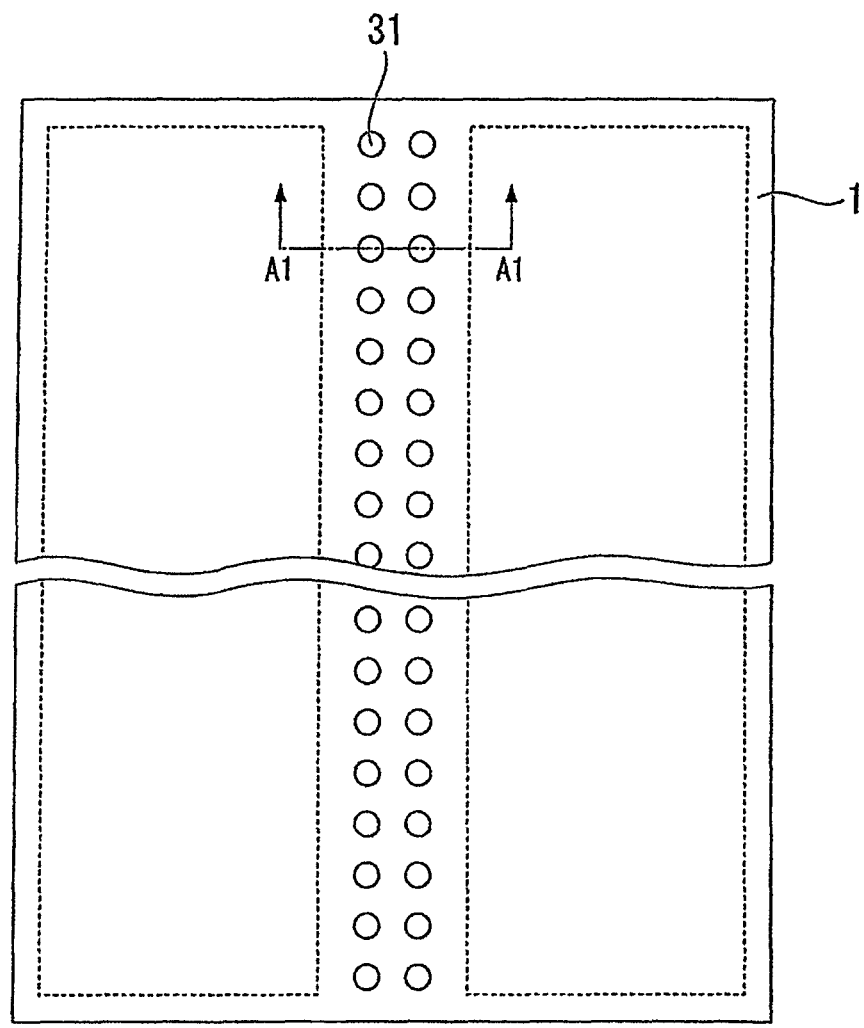
FIG. 1A is a diagram for explaining a configuration of a semiconductor device according to a first embodiment of the invention, and is a plan view showing the top surface of the semiconductor device.
Figure 1B:
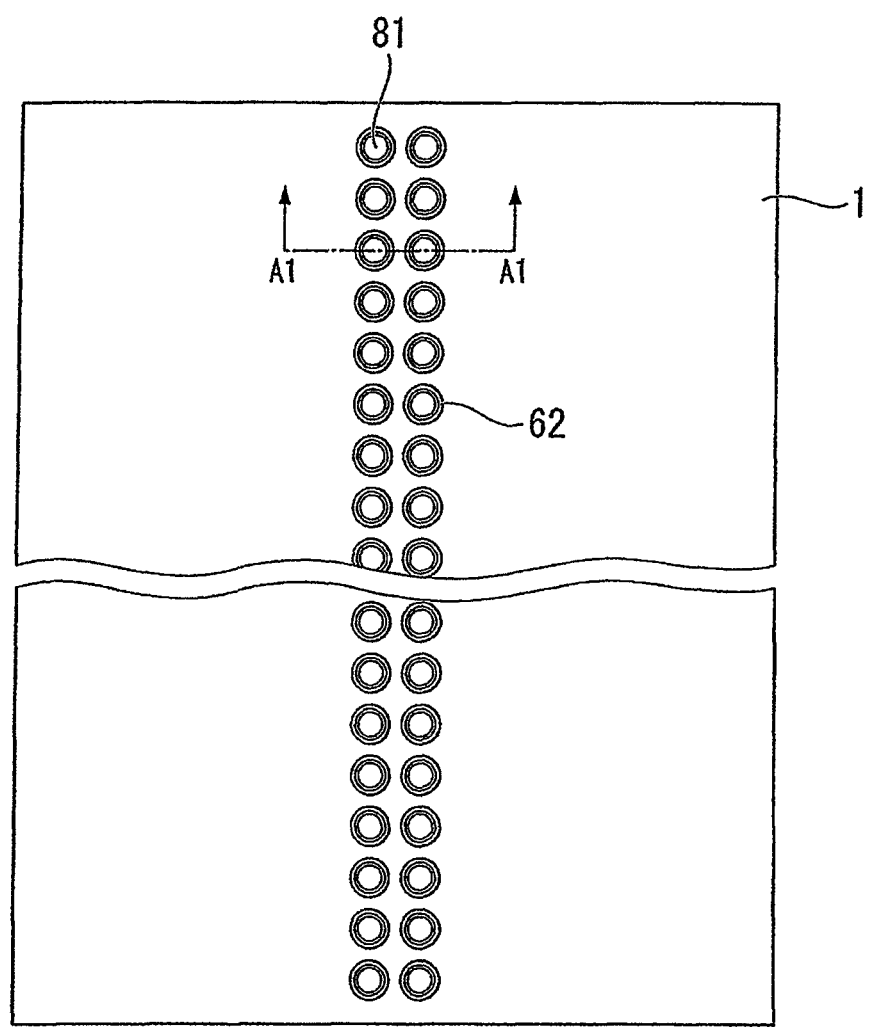
FIG. 1B is a diagram for explaining the configuration of the semiconductor device according to the first embodiment of the invention, and is a plan view showing the rear face of the semiconductor device.
Figure 1C:
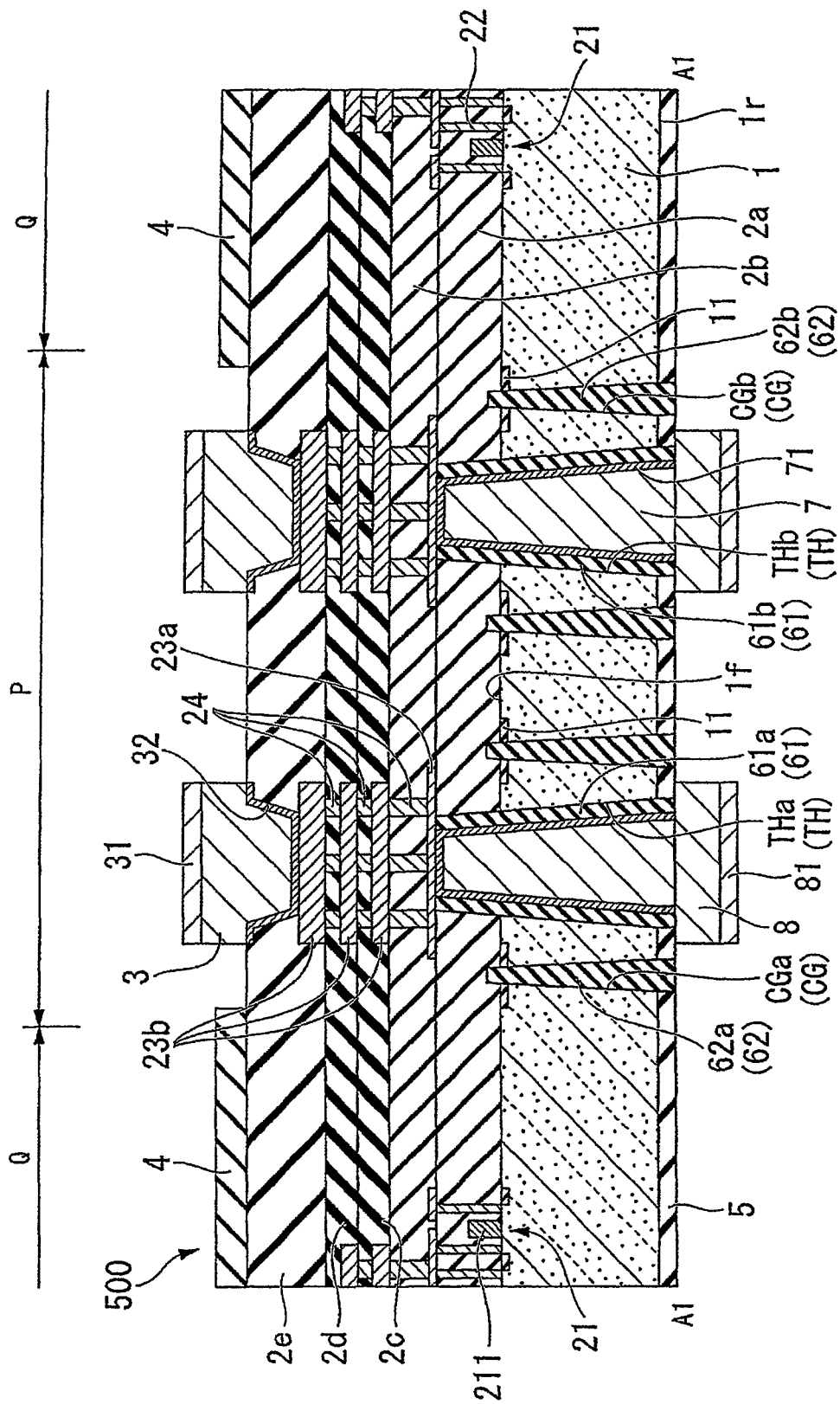
FIG. 1C is a diagram for explaining the configuration of the semiconductor device according to the first embodiment of the invention, and is a cross-sectional view showing a portion indicated by the line A1-A1 in FIGS. 1A and 1B.

FIG. 1A is a diagram for explaining a configuration of a semiconductor device according to a first embodiment of the invention and is plan view showing the top surface of the semiconductor device. FIG. 1B is also a diagram for explaining the configuration of the semiconductor device according to the first embodiment of the invention and is a plan view showing the rear surface of the semiconductor device. FIG. 1C is also a diagram for explaining the configuration of the semiconductor device according to the first embodiment of the invention and is a cross-sectional view showing a portion indicated by the line A1-A1 shown in FIGS. 1A and 1B.

As shown in FIG. 1C, this semiconductor device 500 has a region P of through silicon vias (hereafter abbreviated as "TSV" or "TSVs") formed vertically in a center and element regions Q extending on the opposite sides of the region P.

Referring to the cross-sectional view of FIG. 1C, the semiconductor device 500 is generally configured by stacking first to fifth interlayer insulating films 2a to 2e on a semiconductor substrate 1. A wiring layer 23a and an upper wiring layer 23b are formed between the first to fifth interlayer insulating films 2a to 2e, and these wiring layers are electrically connected through via plugs 24. Some of the wiring layers 23a are formed in a circular shape as the one formed in the TSV region P shown in FIG. 10, and these wiring layers correspond to TSV through holes TH to be described later.

In the element regions Q on the top surface 1f, that is, a circuit formation surface (first major surface) of the semiconductor substrate 1, there are formed a plurality of shallow trench isolation (hereafter, abbreviated as "STI") structures 11, and semiconductor elements 21 each consisting of a gate electrode/gate insulating film 211, a source/drain (S/D) region (not shown) and the like.

Some of the STI structures 11 are formed in a ring shape at least in the TSV region P shown in FIG. 10, and those STI structures correspond to insulating ring annular grooves CG to be described later. Purposes of these will be described later in a description of manufacturing processes. There are formed, in the element regions Q in the first interlayer insulating film 2a, contact plugs 22 for electrically connecting the wiring layer 23a to the semiconductor element 21.

A passivation film 4 made of a resin layer is formed in the element regions Q on the fifth interlayer insulating film 2e. There are formed on the TSV region P on the fifth interlayer insulating film 2e, surface bump electrodes (of copper, for example) 3 each of which is connected to the upper wiring layer 23b formed in the fifth interlayer insulating film 2e via a seed layer 32. A protective film 31 made of gold is formed on the upper surfaces of the surface bump electrodes 3 to prevent oxidation thereof.

The semiconductor substrate 1 has a thickness of about 40 µm. A rear surface protective film 5 of silicon nitride or the like is formed on the rear surface 1r of the semiconductor substrate 1. The insulating ring annular groove CG (CGa, CGb) which is formed by dry etching substantially concentrically with the TSV through hole TH is filled with an insulating material such as silicon oxide, silicon nitride, or the like, whereby a single insulating ring (also referred to as first annular insulating portion, or first annular isolating portion) 62 (62a, 62b) is formed. The side wall of the TSV through hole TH (THa, THb) formed by dry etching is covered with an similar insulating film, whereby a TSV side wall insulating ring (all referred to as a second annular insulating portion, or a second annular isolating portion) 61 (61a, 61b) is formed.

The remaining portion of the TSV through hole TH (THa, THb) is filled with a conductive material such as copper with a seed/barrier layer 71 interposed therebetween, whereby a TSV 7 is formed. A rear surface bump electrode (of copper, for example) 8 is further formed to cover the exposed portion of the TSV 7, and a solder 81 is formed on the surface of the bump electrode by plating.

Functions of the wiring layer 23a and the STI structure 11 provided in the TSV region P will be described later together with description of the manufacturing processes. The same applies to description of thicknesses of the TSV side-wall insulating ring 61 and the single insulating ring 62.

Figure 2B:
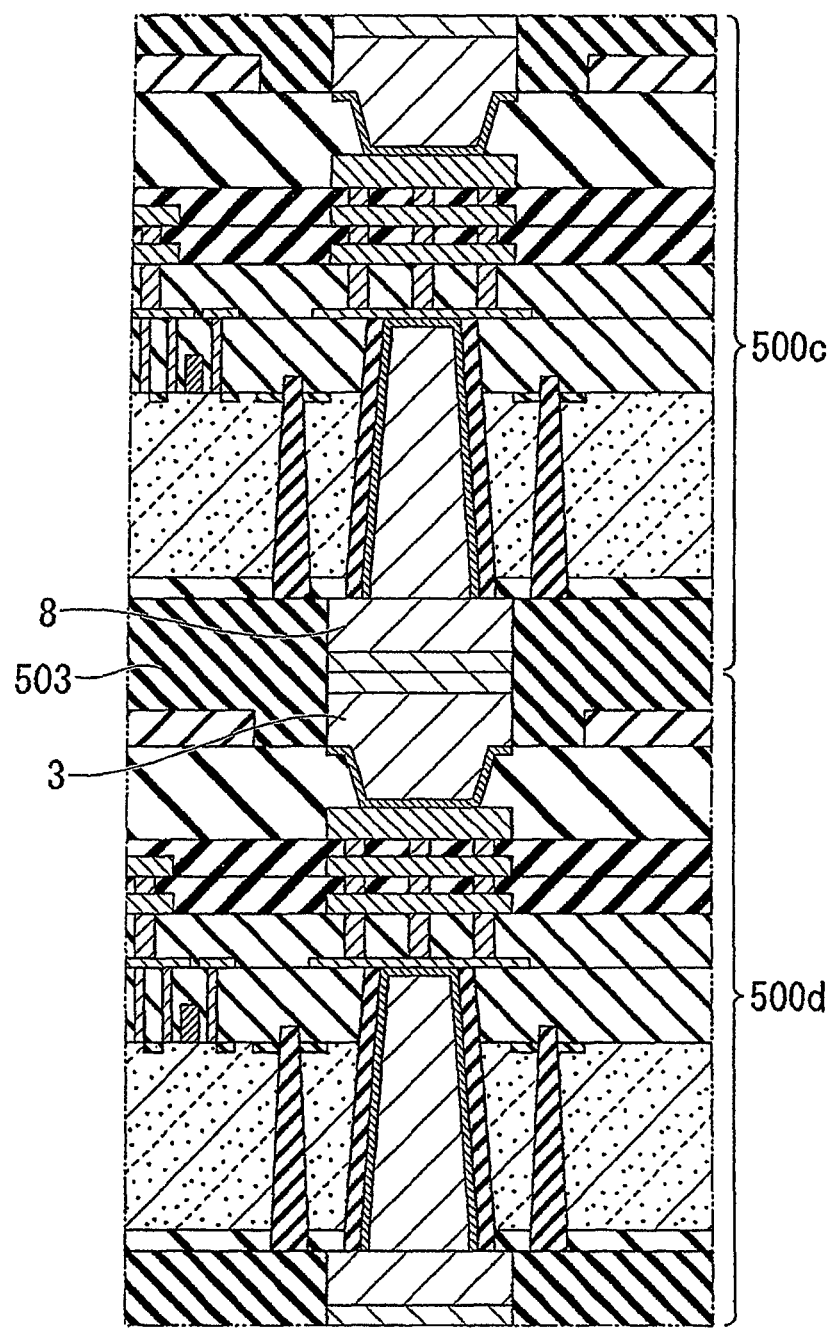
FIG. 2B is an enlarged cross-sectional view showing a region indicated as S in FIG. 2A.

FIG. 2A is a cross-sectional view showing the entirety of a stacked structure in which the semiconductor device shown in FIGS. 1A to 1C is stacked in plurality. FIG. 2B is an enlarged cross-sectional view of a region indicated as S in FIG. 2A.

Referring to FIGS. 2A and 2B, a plurality of semiconductor devices 500a to 500h are stacked on one of the surfaces of a package substrate 501. The semiconductor devices 500a to 500h assume a stacked structure in which each of the semiconductor devices 500a to 500h is electrically connected to the semiconductor devices located in the upper and lower layers thereof via the surface bump electrodes 3 and the rear surface bump electrodes 8 (see FIG. 2B). The semiconductor devices 500a to 500h are covered with a mold resin 502 while internal air gaps are filled with an underfill material 503, whereby the semiconductor devices 500a to 500h are sealed in the mold resin 502. A plurality of solder balls 504 are formed on the other surface of the package substrate 501.

Next, a manufacturing method of the semiconductor device shown in FIGS. 1A to 1C according to the first embodiment of the invention will be described. FIG. 3 to FIG. 9 (FIGS. 9A and 9B) are diagrams for explaining the manufacturing method sequentially.

Figure 3:
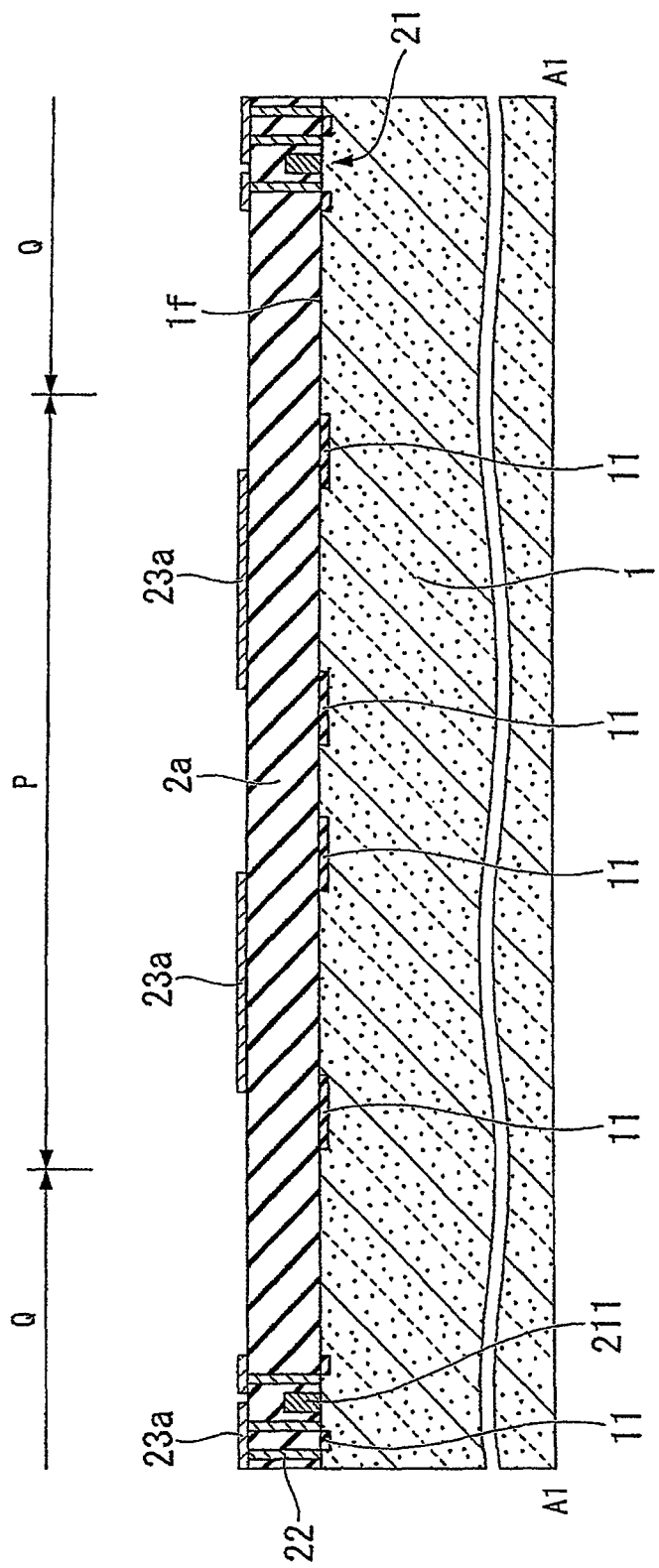
FIG. 3 is a diagram for explaining a manufacturing method of the semiconductor device according to the first embodiment of the invention.

Firstly, in order to obtain the structure shown in FIG. 3, a plurality of STI structures 11 are formed on the top surface 1f, that is, on the circuit formation side (first major surface) of the semiconductor substrate 1. Further, semiconductor elements 21 each consisting of a gate electrode/gate insulating film 211, a source/drain (S/D) region (not shown) and the like are formed, and then a first interlayer insulating film 2a is stacked on the top surface 1f of the semiconductor substrate 1.

Subsequently, wiring layers 23a made of a conductor such as aluminum or tungsten are formed on the first interlayer insulating film 2a by dry etching using a photo resist (PR) as a mask. There are also formed, in the first interlayer insulating film 2a, contact plugs 22 for electrically connecting the wiring layers 23a and the semiconductor elements 21.

Figure 4:
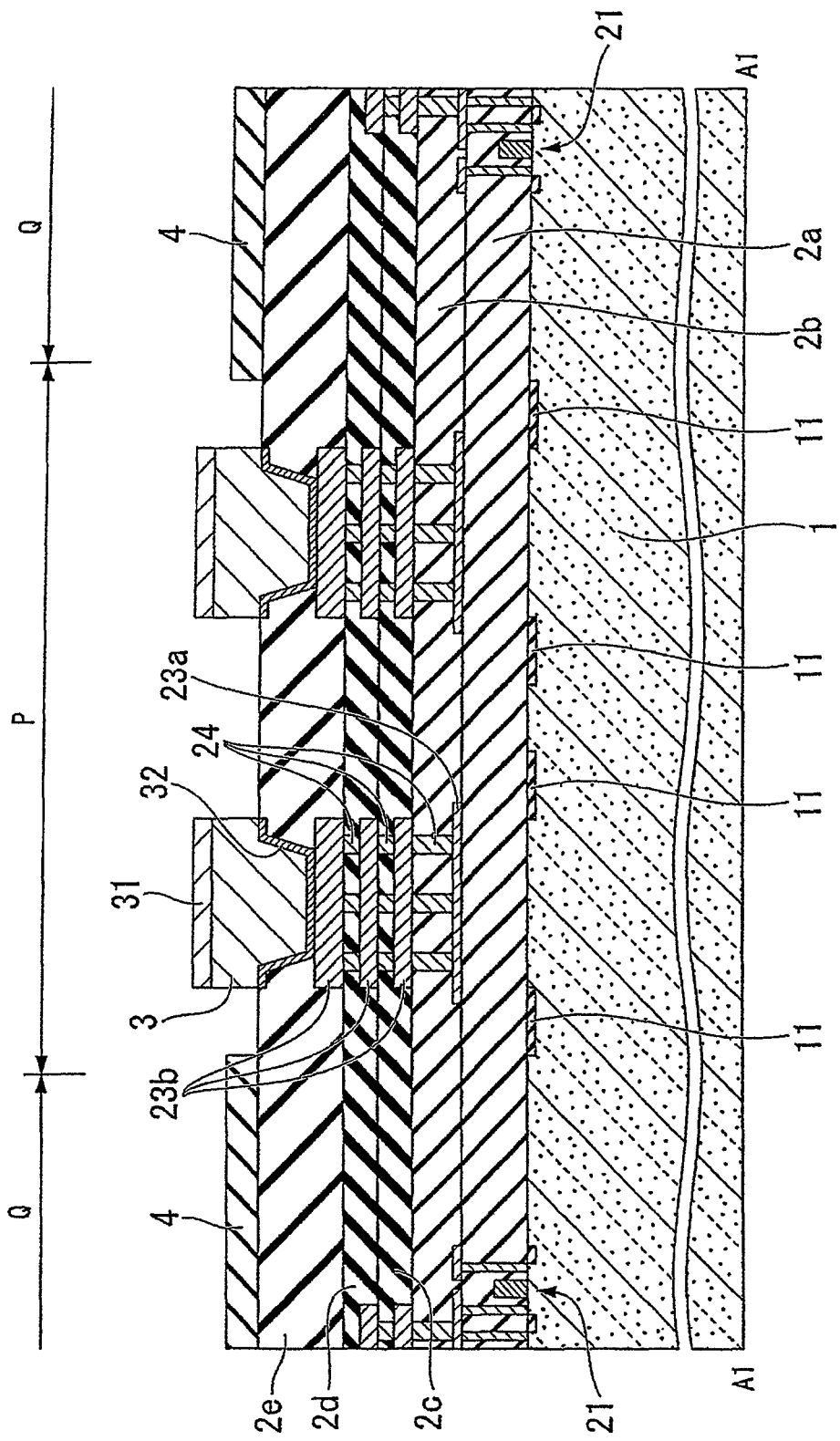
FIG. 4 is a diagram for explaining the manufacturing method of the semiconductor device according to the first embodiment of the invention.

Referring to FIG. 4, second to fifth interlayer insulating films 2b to 2e are further stacked on the first interlayer insulating film 2a. Each of the second to fifth interlayer insulating films 2b to 2e is provided with an upper wiring layer (made of aluminum or copper, for example) 23b. The upper wiring layers 23b and the wiring layers 23a are electrically connected through via plugs 24.

Subsequently, a passivation film 4, that is a resin layer, is formed on the fifth interlayer insulating film 2e. Pad openings are formed in the fifth interlayer insulating film 2e, and a surface bump electrode (of copper, for example) 3 is formed in each of the pad openings by a known method such as electroplating or the like, via the upper wiring layer 23b and the seed layer 32 formed in the fifth interlayer insulating film 2e. A protective film 31 made of gold or the like is formed on the top face of the surface bump electrode 3 in order to prevent oxidation thereof.

Figure 5:
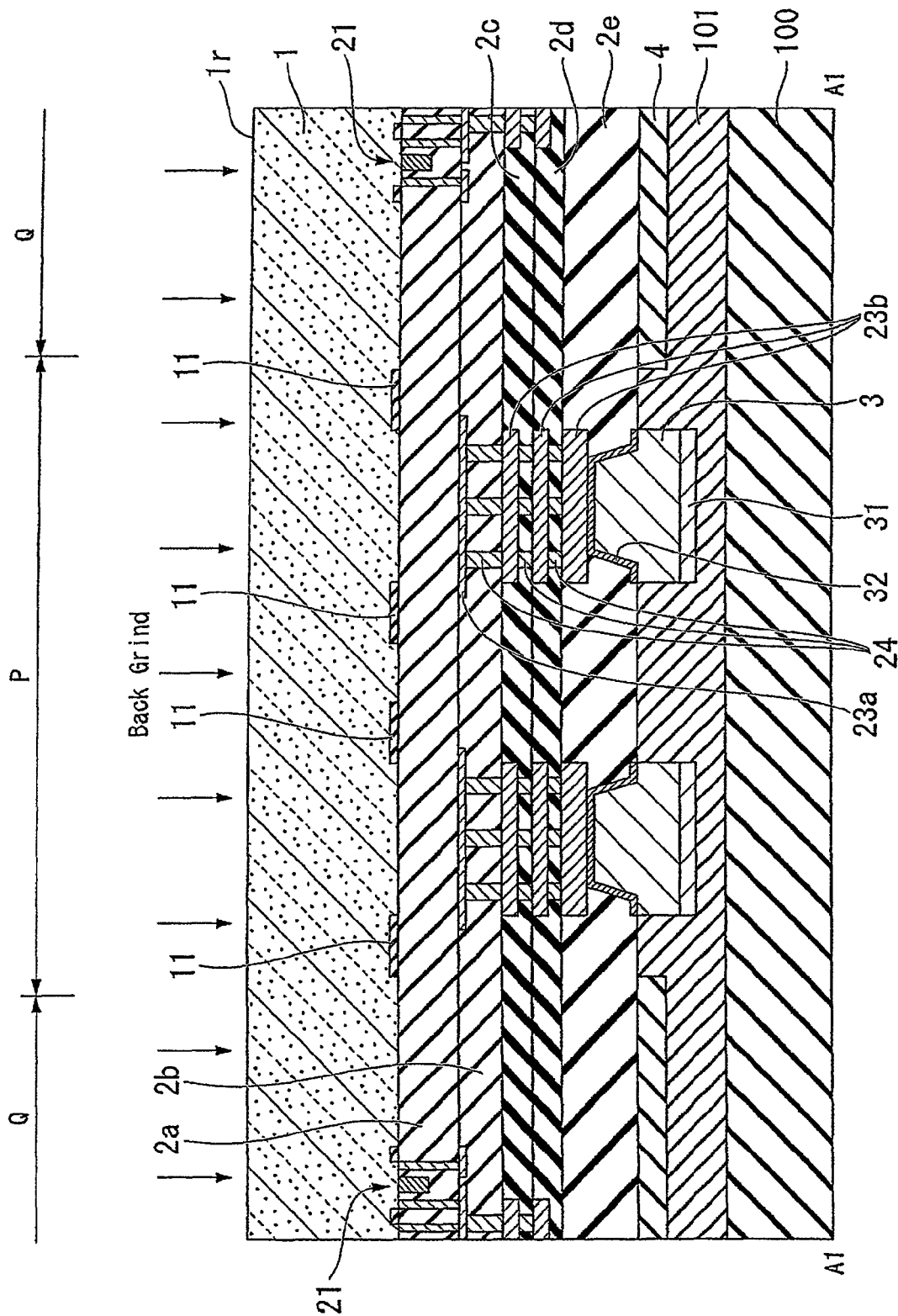
FIG. 5 is a diagram for explaining the manufacturing method of the semiconductor device according to the first embodiment of the invention.

Referring to FIG. 5, a wafer support system (WSS) 100 formed of silicon oxide or the like is attached with an adhesive 101 to the side where the surface bump electrodes 3 are formed. It should be noted that, for the sake of convenience of description, the structure, which has been shown in normal position in FIGS. 1 to 4, is shown upside-down in FIGS. 5 to 11. The thickness of the semiconductor substrate 1 is reduced to about 40 µm by back-grinding the rear surface (second major surface) 1r of the semiconductor substrate 1.

Figure 6A:
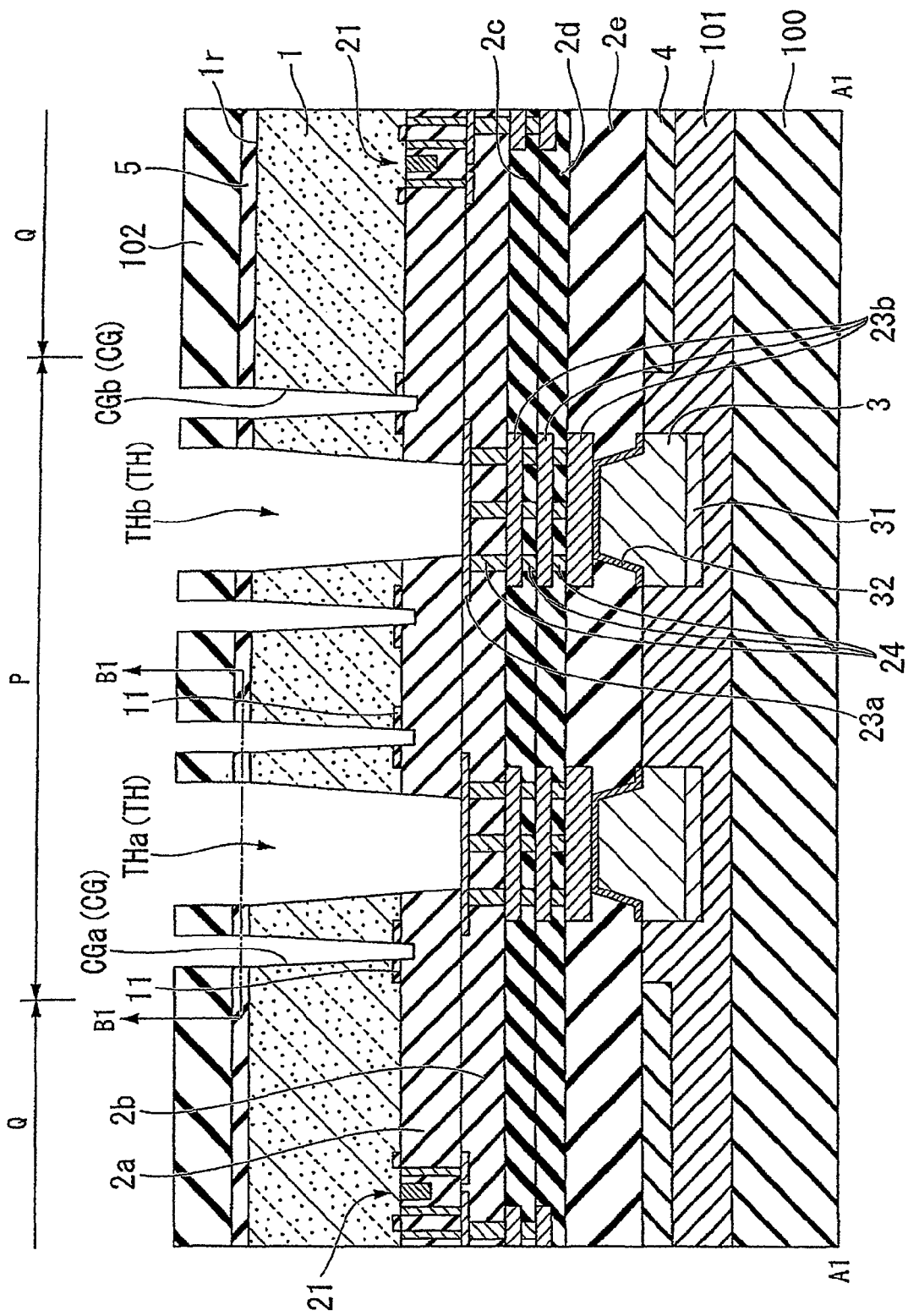
FIG. 6A is a diagram for explaining the manufacturing method of the semiconductor device according to the first embodiment of the invention.
Figure 6B:
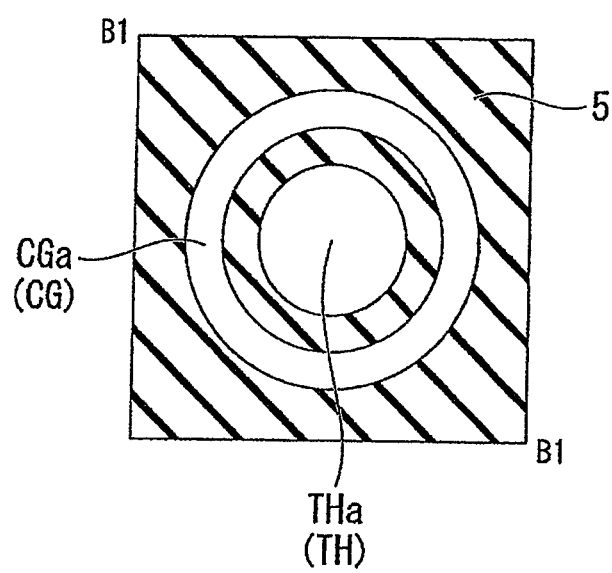
FIG. 6B is a plane cross-sectional view showing a portion indicated by the line B1-B1 in FIG. 6A.

Referring to FIG. 6A, a rear surface protective film 5 of silicon nitride or the like is formed on the rear surface 1r of the semiconductor substrate 1, and further a photo resist (PR) 102 is formed thereon, having patterns for forming TSV through holes TH and insulating ring annular grooves CG to be described later. The TSV through holes THa, THb and the insulating ring annular grooves CGa, CGb are formed collectively by dry etching using the photo resist 102 as a mask. FIG. 6B is a plane cross-sectional view of a portion indicated by the line B1-B1 in FIG. 6A.

The wiring layer 23a formed in the TSV region P functions as a stopper film in this dry etching process to form the TSV through holes TH. Thus, this wiring layer 23a functions as described above in addition to its original function to realize conduction with the upper wiring layer 23b by being in contact with a through silicon via to be described later.

Likewise, the STI structure 11 formed in the TSV region P functions as a stopper film in the dry etching process to form an insulating ring annular groove CG (CGa, CGb).

Describing this more particularly, the TSV through holes TH (THa, THb) must be formed to penetrate through the interlayer insulating film 2a and reach the wiring layers 23a. Therefore, if the insulating ring annular grooves CG (CGa, CGb) and the TSV through holes TH are formed in the same process like in the first embodiment, the insulating ring annular grooves CG will also penetrate through the interlayer insulating film 2a unless some effective measures are taken.

In contrast, when it is desired that the insulating ring annular groove CG should penetrate into the interlayer insulating film 2a by a small amount, this can be realized by arranging the STI structure 11. It is also possible to form the insulating ring annular groove CG so as not to completely penetrate through the STI structure 11 by appropriately setting the selection ratio between the STI structure 11 and the interlayer insulating film 2a.

In this manner, the arrangement of the STI structure 11 in the TSV region P makes it possible to appropriately set the amount by which the insulating ring annular groove CG penetrates into the interlayer insulating film 2a. FIG. 6A shows a state in which the bottoms of the insulating ring annular grooves CG (CGa, CGb) are located at a small distance from the surface of the interlayer insulating film 2a.

In the first embodiment, as shown in FIG. 6A, both of the TSV through hole TH and the insulating ring annular groove CG are formed in such a manner that the side wall of the opening is tapered so that the cross-sectional area of the opening becomes smaller from the rear surface 1r of the semiconductor substrate 1 toward the surface where the elements are formed. This configuration is preferable since it makes it easy to embed an insulating film in a later process (process shown in FIG. 7). This configuration can be realized only by the method of first embodiment in which after the semiconductor substrate 1 is ground as described above, both of the TSV through hole TH and the insulating ring annular groove CG are formed collectively by a via-last process which opens the holes from the rear surface. If it is desired to reduce the area occupied by the TSVs and insulating rings to be described later, the inclination of the taper can be as small as possible (close to a vertical shape).

Figure 7:
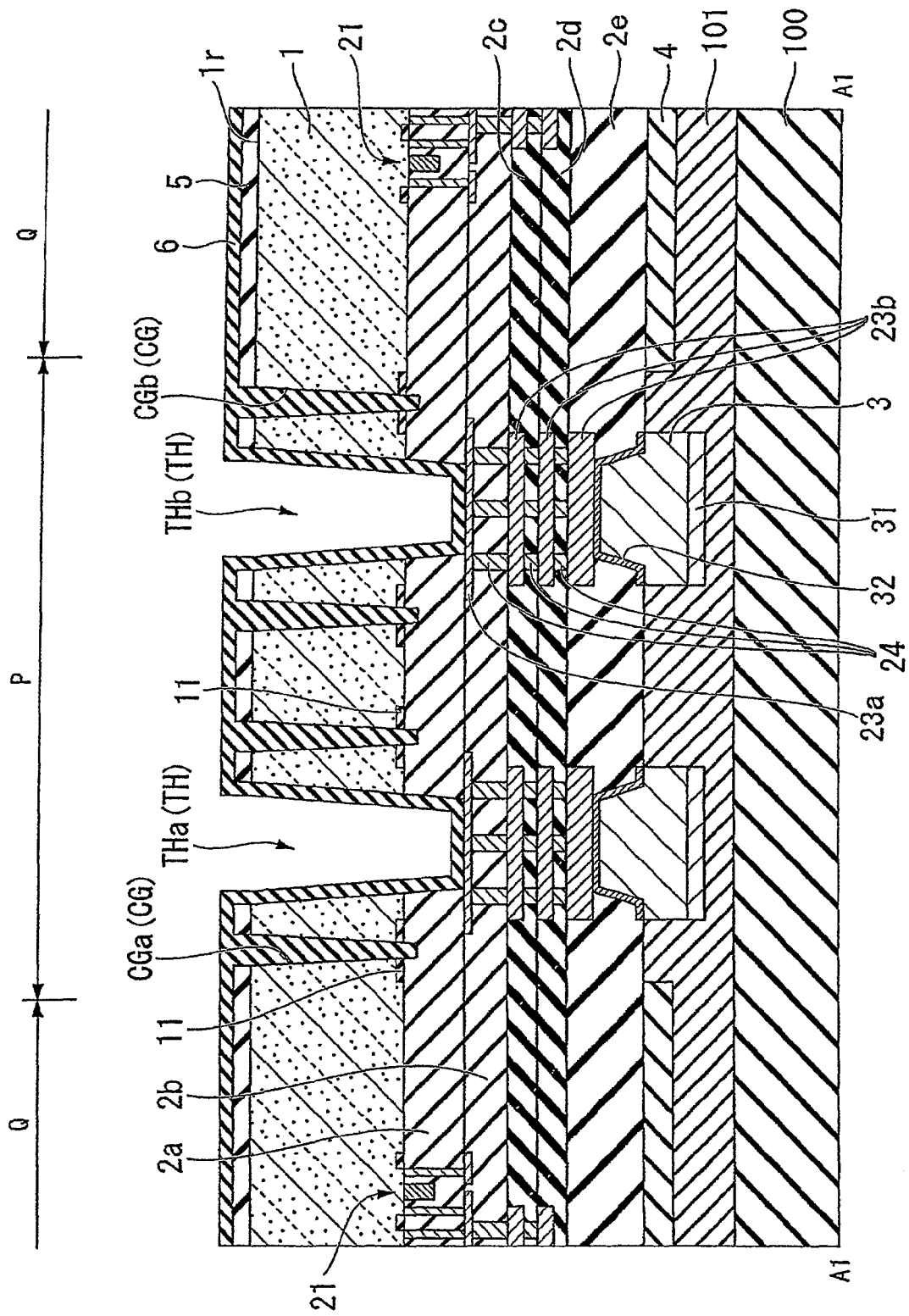
FIG. 7 is a diagram for explaining the manufacturing method of the semiconductor device according to the first embodiment of the invention.

Referring to FIG. 7, after the photo resist 102 is removed, an insulating film 6 is formed to cover the surface of the remaining rear surface protective film 5, the TSV through holes TH (THa, THb) and the insulating ring annular grooves CG (CGa, CGb). This insulating film 6 may be formed of a silicon oxide film, a silicon nitride film, or a stacked film thereof.

The insulating film 6 is formed so as to cover the side and bottom faces of the TSV through holes TH. As for the insulating ring annular grooves CG, when the insulating ring annular grooves CG are to be filled as in this first embodiment, unlike the second embodiment as described later in which the insulating ring annular grooves CG are formed to have an air gap in the inside thereof, the insulating film 6 is formed to have a thickness corresponding to about a half of the width of the insulating ring annular grooves CG.

Figure 8A:
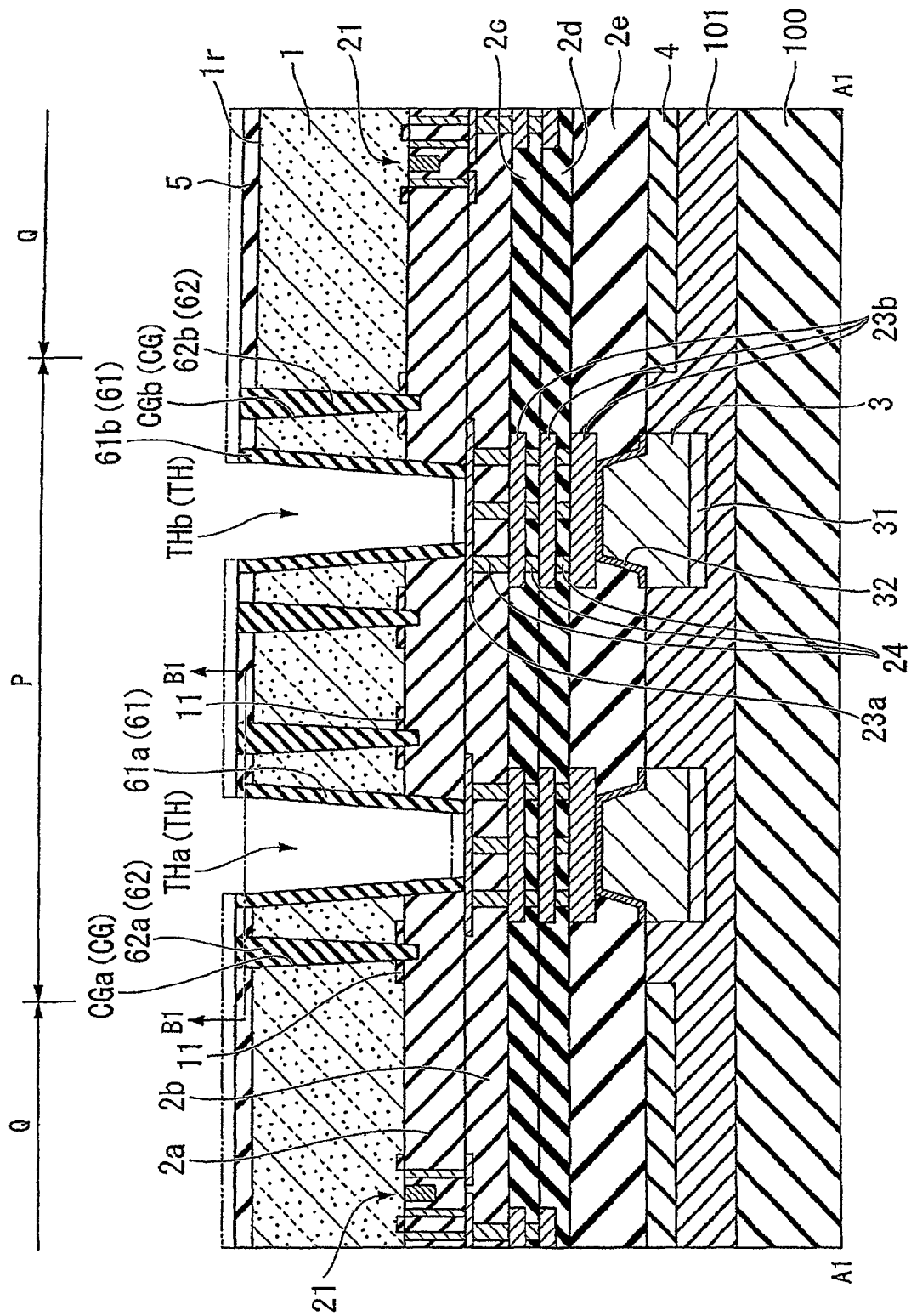
FIG. 8A is a diagram for explaining the manufacturing method of the semiconductor device according to the first embodiment of the invention.
Figure 8B:
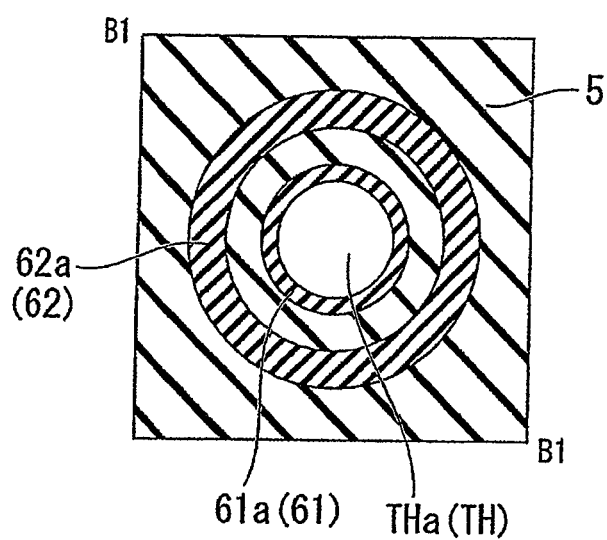
FIG. 8B is a plane cross-sectional view showing a portion indicated by the line B1-B1 in FIG. 8A.

Referring to FIG. 8A, the insulating film is removed (etched back) by anisotropic etching only from the surface of the rear surface protective film 5 and the bottoms of the TSV through holes TH (THa, THb) as indicated by the two-dot chain lines. TSV side-wall insulating rings 61 (61a, 61b) are thereby formed on the side faces of the TSV through holes TH, and single insulating rings 62 (62a, 62b) are formed in the insulating ring annular grooves CG (CGa, CGb). FIG. 8B is a plane cross-sectional view of a portion indicated by the line B1-B1 in FIG. 8A.

The arrangement of the single insulating rings 62 (62a, 62b) makes it possible to reduce the thickness of the TSV side-wall insulating rings 61 (61, 61b). For example, in the configuration of the first embodiment, as described above, the thickness of the TSV side-wall insulating rings 61 corresponds to the width of the insulating ring annular groove CG (CGa, CGb), in other words, to about a half of the thickness of the single insulating rings 62. Therefore, the thickness of the TSV side-wall insulating rings 61 can be reduced to about one third of the thickness when only the TSV side-wall insulating rings are provided.

Thus, according to the configuration of the first embodiment, the thickness of the insulating film 6 required for the TSV side-wall insulating rings 61 can be reduced by the arrangement of the single insulating rings 62. This means that the insulating film 6 on the bottom of the TSV through holes TH that is to be removed in the aforementioned dry etching process can be reduced, and hence possible etching damage to the underlying wiring layer 23a can be reduced. As a result, contact resistance can be reduced.

Figure 9A:
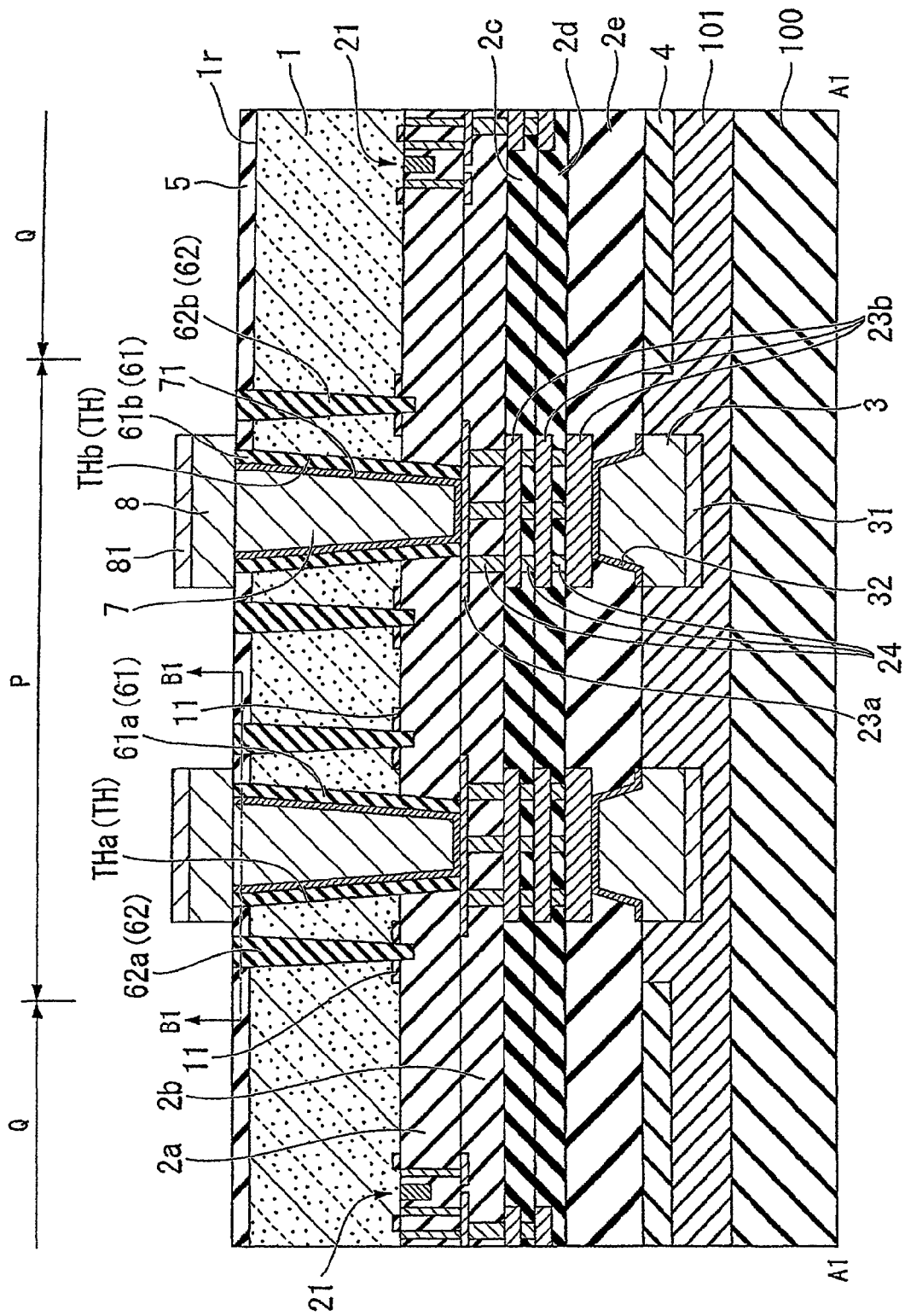
FIG. 9A is a diagram for explaining the manufacturing method of the semiconductor device according to the first embodiment of the invention.
Figure 9B:
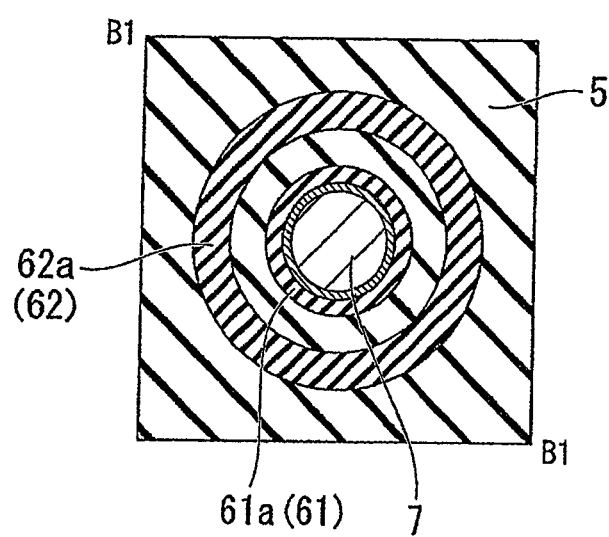
FIG. 9B is a plane cross-sectional view showing a portion indicated by the line B1-B1 in FIG. 9A

Referring to FIG. 9A, after a seed/barrier layer 71 is formed thin within the TSV through holes TH (THa, THb), the TSV through holes TH (THa, THb) are filled with a conductive material such as copper to form TSVs 7. The seed/barrier layer 71 consists of a seed layer formed of copper and a barrier layer formed of titanium, titanium nitride, tantalum, tantalum nitride, or a stacked layer thereof. These materials are selected in view of the functions of the TSVs 7 as diffusion barriers to the element region and adhesion properties between the TSV 7 and the TSV side-wall insulating rings 61. Finally, pillars of rear surface bump electrodes (of copper, for example) 8 are formed to cover the exposed portions of the TSVs 7, and the surfaces of these rear surface bump electrodes 8 are plated with a solder 81. FIG. 9B is a plane cross-sectional view of the portion indicated by the line B1-B1 in FIG. 9A. This is followed by known processes of dicing, stacking and the like.

According to the semiconductor device 500 and the manufacturing method thereof of this embodiment, the thickness of the insulating film 6 formed in the TSV through holes TH (THa, THb) is reduced to improve the processability, while the insulating ring annular grooves CG (CGa, CGb) filled with an insulating material are provided to ensure a sufficient overall thickness of the insulator, whereby improvement of the insulating properties of the TSVs (through silicon vias) 7, reduction of the parasitic capacity, and/or a functionality of prevention of diffusion can be realized.

Further, the TSV through holes TH and the insulating ring annular grooves CG are formed such that the cross-sectional areas thereof are gradually reduced from the openings on the rear surface 1r (second major surface) of the semiconductor substrate 1 toward the top surface 1f (first major surface) of the semiconductor substrate 1, whereby the easiness to embed the insulating film can be improved.

The STI (shallow trench isolation) structure 11 is formed in a portion corresponding to the insulating ring annular groove CG between the semiconductor substrate 1 and the first interlayer insulating film 2a, whereby the distance by which the insulating ring annular groove CG extends from the surface of the semiconductor substrate 1 can be adjusted.

First Modification of First Embodiment

Figure 10A:
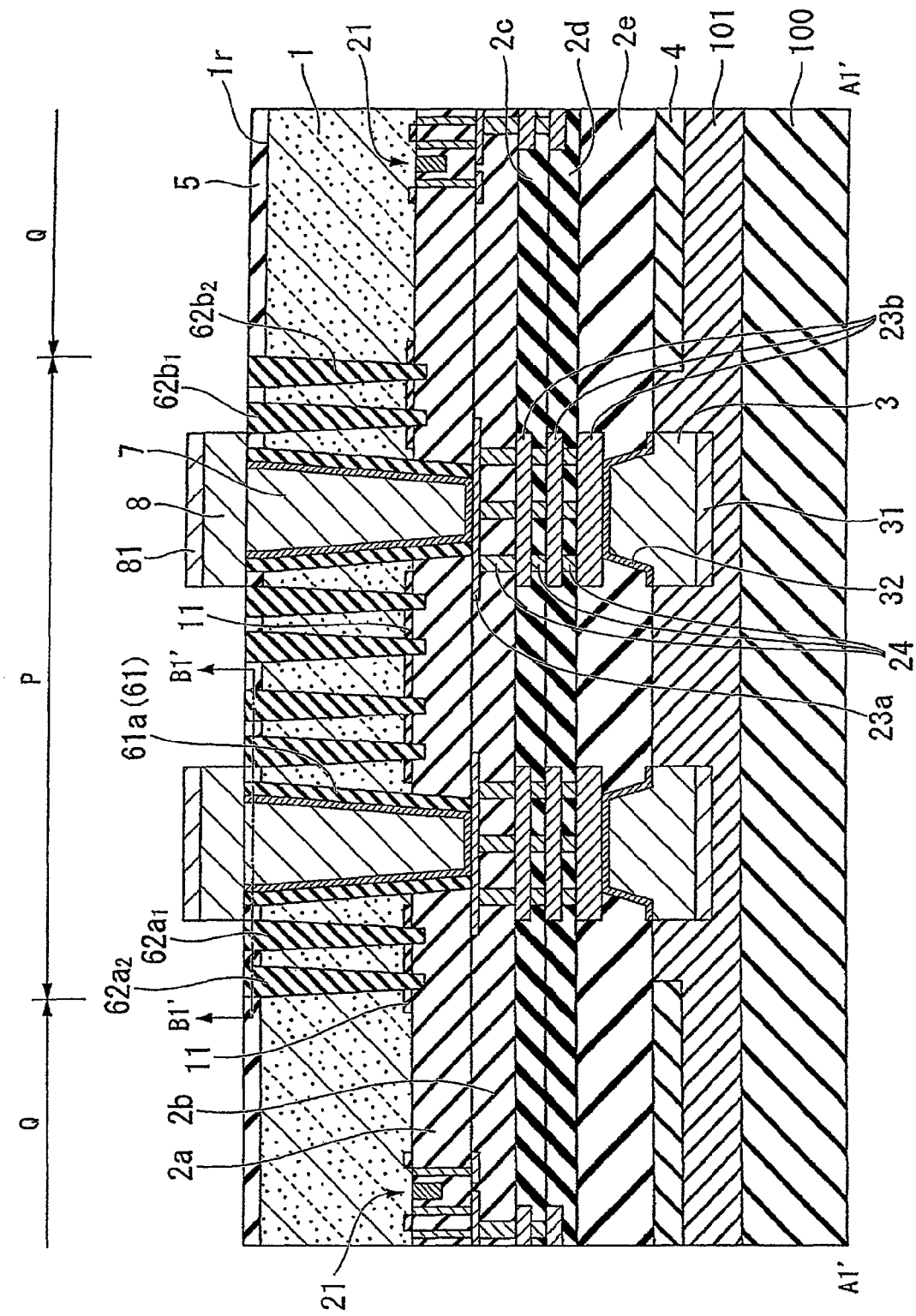
FIG. 10A is a cross-sectional view for explaining a semiconductor device according to a first modification of the first embodiment.
Figure 10B:
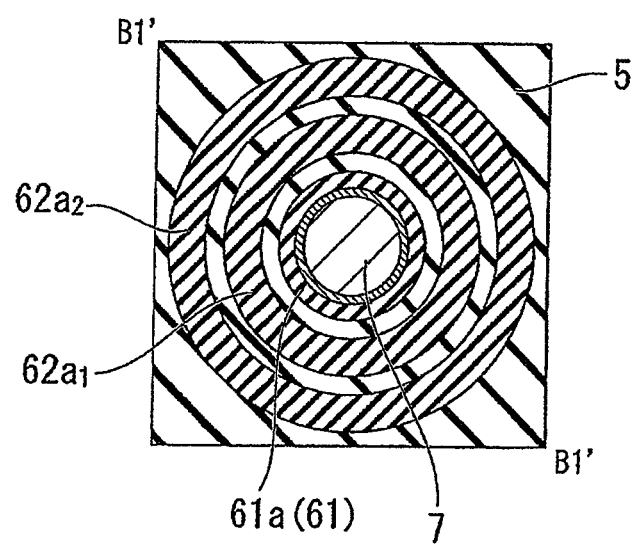
FIG. 10B is a plane cross-sectional view showing a portion indicated by the line B1'-B1' in FIG. 10A.

Modifications of the first embodiment will be described. FIG. 10A is a diagram for explaining a semiconductor device according to a first modification of the first embodiment, and is a cross-sectional view corresponding to FIG. 9A. FIG. 10B is a plane cross-sectional view showing a portion indicated by the line B1'-B1' in FIG. 10A. Like components to those of the semiconductor device shown in FIGS. 9A and 9B are denoted by the same reference numerals and description thereof will be omitted.

Different features from the first embodiment shown in FIGS. 9A and 9B will be described. In the first embodiment shown in FIGS. 9A and 9B, one single insulating ring 62 ($62a$, $62b$) is provided around each of the TSV through holes TH, whereas in the first modification of the first embodiment shown in FIGS. 10A and 10B, multiple (a plurality of) single insulating rings are provided around each of the TSV through holes TH. Specifically, as shown in FIGS. 10A and 10B, for example, two single insulating rings (a first single insulating ring $62a_1$, $62b_1$ and a second single insulating ring $62a_2$, $62b_2$) formed substantially concentrically are provided.

When a double ring structure like this is employed, for example, the thickness of the TSV side-wall insulating ring 61 can be reduced to about one fifth of the thickness required when the TSV side-wall insulating ring alone is provided. Accordingly, the thickness of the insulating film covering the side wall of the TSV through hole TH can be further reduced by employing a multiple single insulating ring structure, and advantageous effects obtained thereby become further remarkable. However, from the viewpoint of area occupied by the single insulating ring(s) (area occupied by the TSV region P), the structure in which one single insulating ring is provided is more effective. Thus, according to the method of the first embodiment, it is possible to realize either the structure in which one single insulating ring is provided which is effective from the viewpoint of the occupied area or the structure in which multiple insulating rings are provided which is effective from the viewpoint of the thickness of the embedding film. This means that a desired one of the structures can be selected to satisfy desired characteristics.

Second Modification of First Embodiment

Figure 11A:
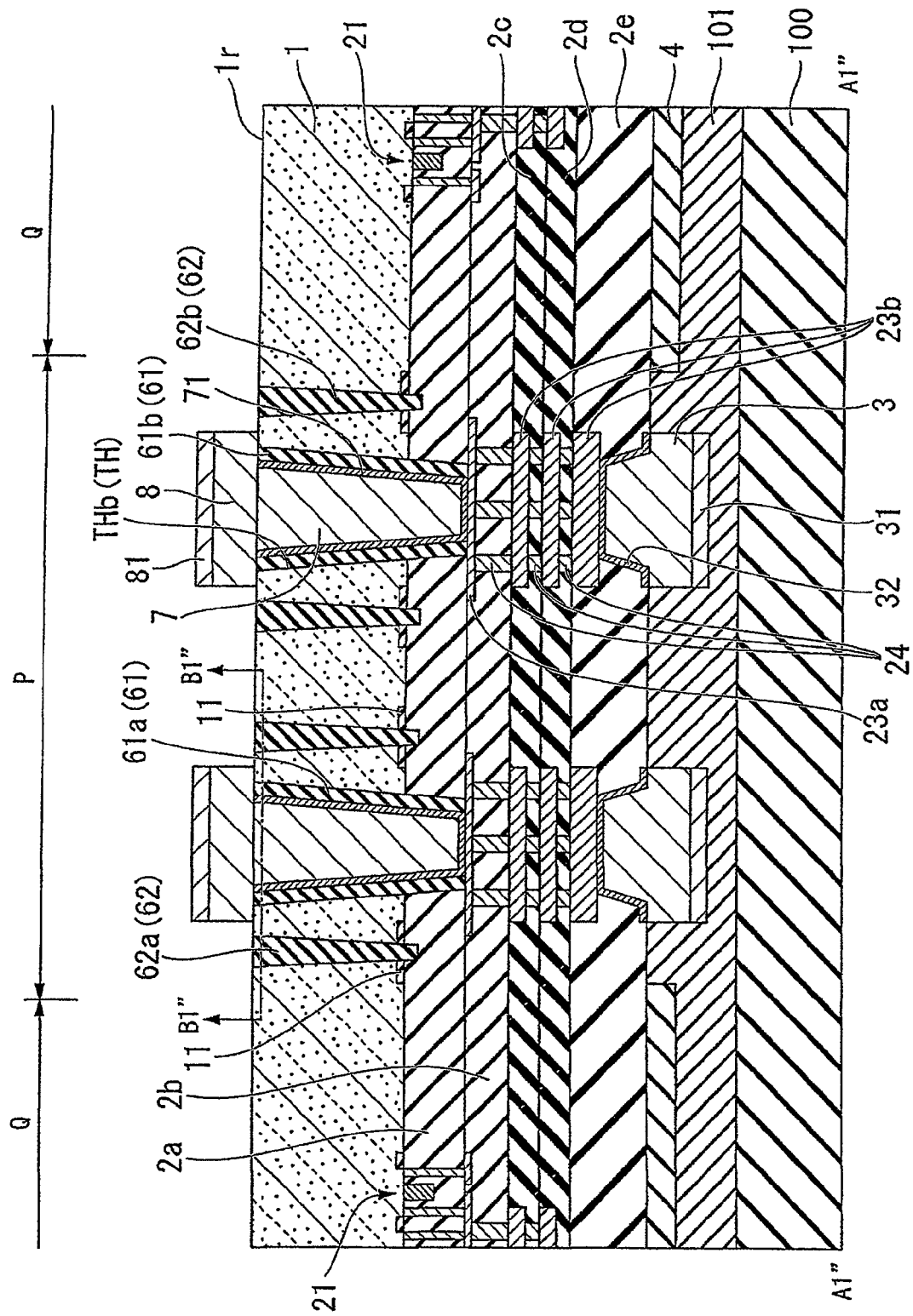
FIG. 11A is a cross-sectional view for explaining a the semiconductor device according to a second modification of the first embodiment.
Figure 11B:
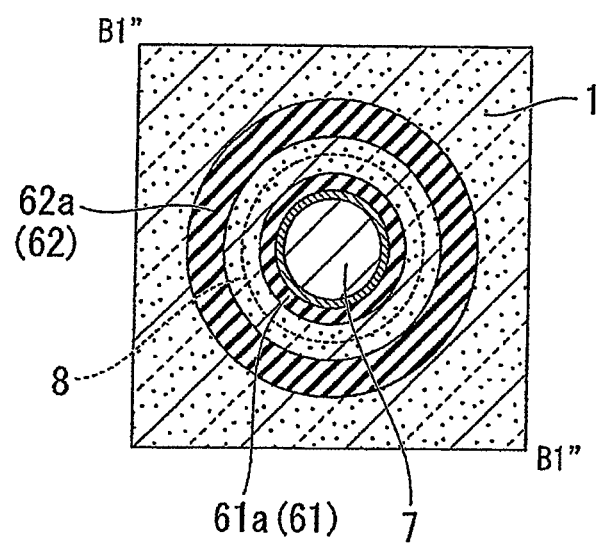
FIG. 11B is a plane cross-sectional view showing a portion indicated by the line in FIG. 11A.

FIG. 11A is a diagram for explaining a semiconductor device according to a second modification of the first embodiment, and is a cross-sectional view corresponding to FIG. 9A. FIG. 11B is a plane cross-sectional view showing a portion indicated by the line B1"-B1" in FIG. 11A. Like components to those of the semiconductor device shown in FIGS. 9A and 9B are denoted by the same reference numerals and description thereof will be omitted.

Different features from the first embodiment shown in FIGS. 9A and 9B will be described. In the first embodiment shown in FIGS. 9A and 9B, the rear surface protective film 5 is provided on the rear surface (second major surface) 1*r* of the semiconductor substrate 1, whereas in the second modification shown in FIGS. 11A and 11B, the rear surface protective film is omitted.

As shown in FIG. 11A, when the diameter of each of the rear surface bump electrodes 8 is made greater than that of the TSV through holes TH so that the rear surface bump electrode 8 extends over the TSV side-wall insulating ring 61 to be in contact with the rear surface 1*r* of the semiconductor substrate 1 (this state is called "bump overhang state"), parasitic capacity will be generated by the rear surface bump electrode 8 being in contact with the rear surface 1*r* of the semiconductor substrate 1 unless the single insulating ring 62 as the one in the embodiment of the invention is provided. Accordingly, in this case, it is desirable to provide a protective film formed in a thickness of the order of several μm in order to alleviate the parasitic capacity. On the other hand, since the parasitic capacity can be alleviated by providing the single insulating ring 62 as in the embodiment of the invention, it is also possible to select a configuration in which no protective film is provided. In this case, the process of providing a protective film can be omitted. However, if functions are desired as a diffusion barrier to the TSV element region or a barrier for selective processing after formation of the bumps, it is more effective and preferable to provide a protective film as in the aforementioned first embodiment and other modifications thereof. In this manner, according to this second modification, it is possible to both the configuration in which a protection film is provided to realize high reliability and high process resistance, and the configuration in which no protective film is provided to simplify the manufacturing processes, and hence it is possible to select either of these configurations.

Second Embodiment

Next, a semiconductor device according to a second embodiment of the invention will be described.

Figure 12A:
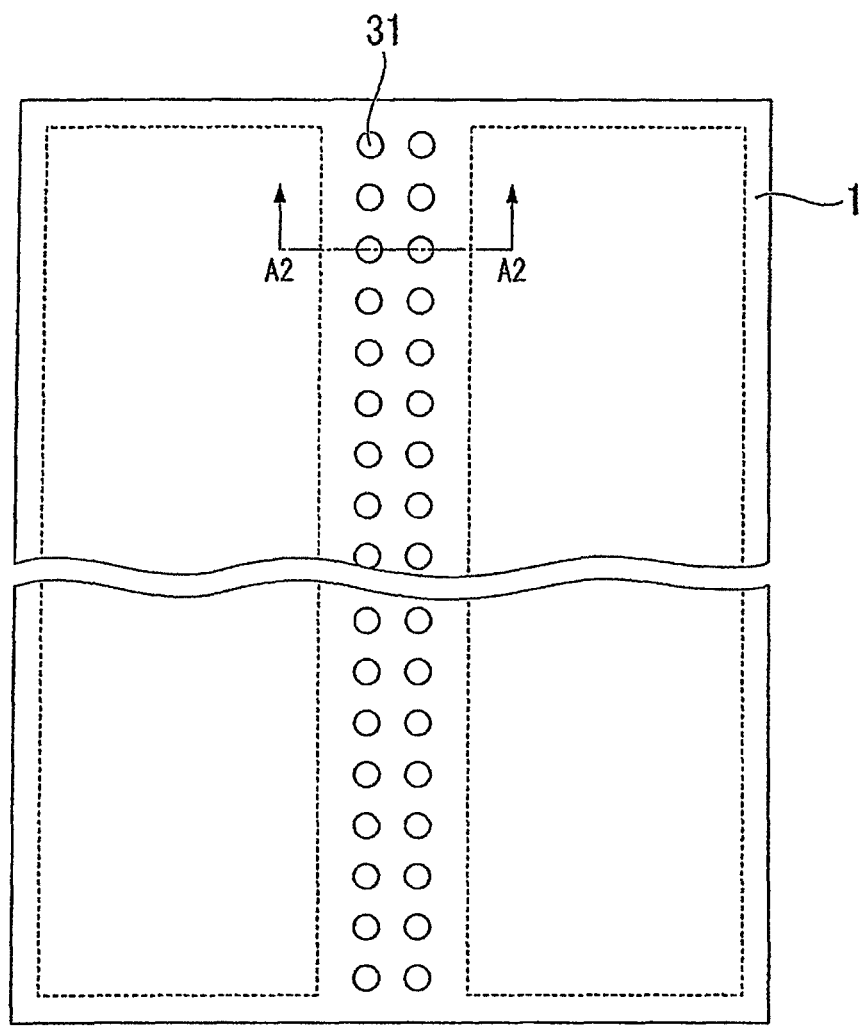
FIG. 12A is a diagram for explaining a configuration of a semiconductor device according to a second embodiment of the invention and is a plan view showing the top surface of the semiconductor device.
Figure 12B:
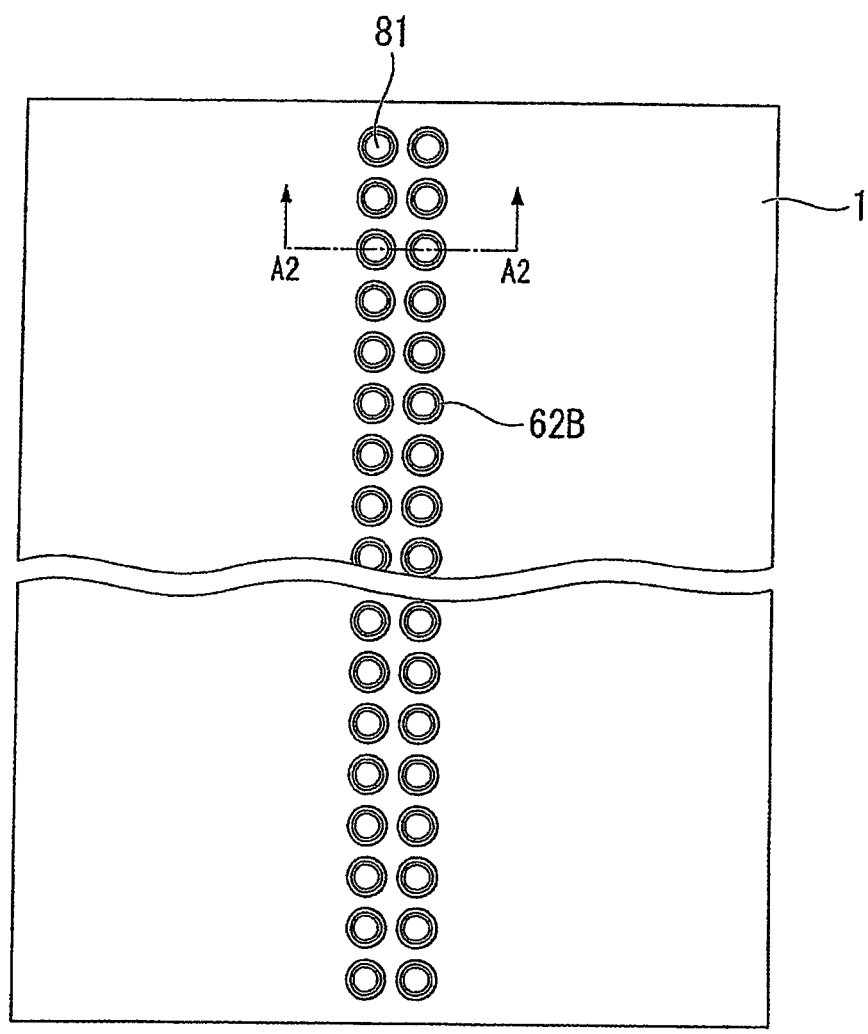
FIG. 12B is a diagram for explaining the configuration of the semiconductor device according to the second embodiment of the invention and is a plan view showing the rear surface of the semiconductor device.
Figure 12C:
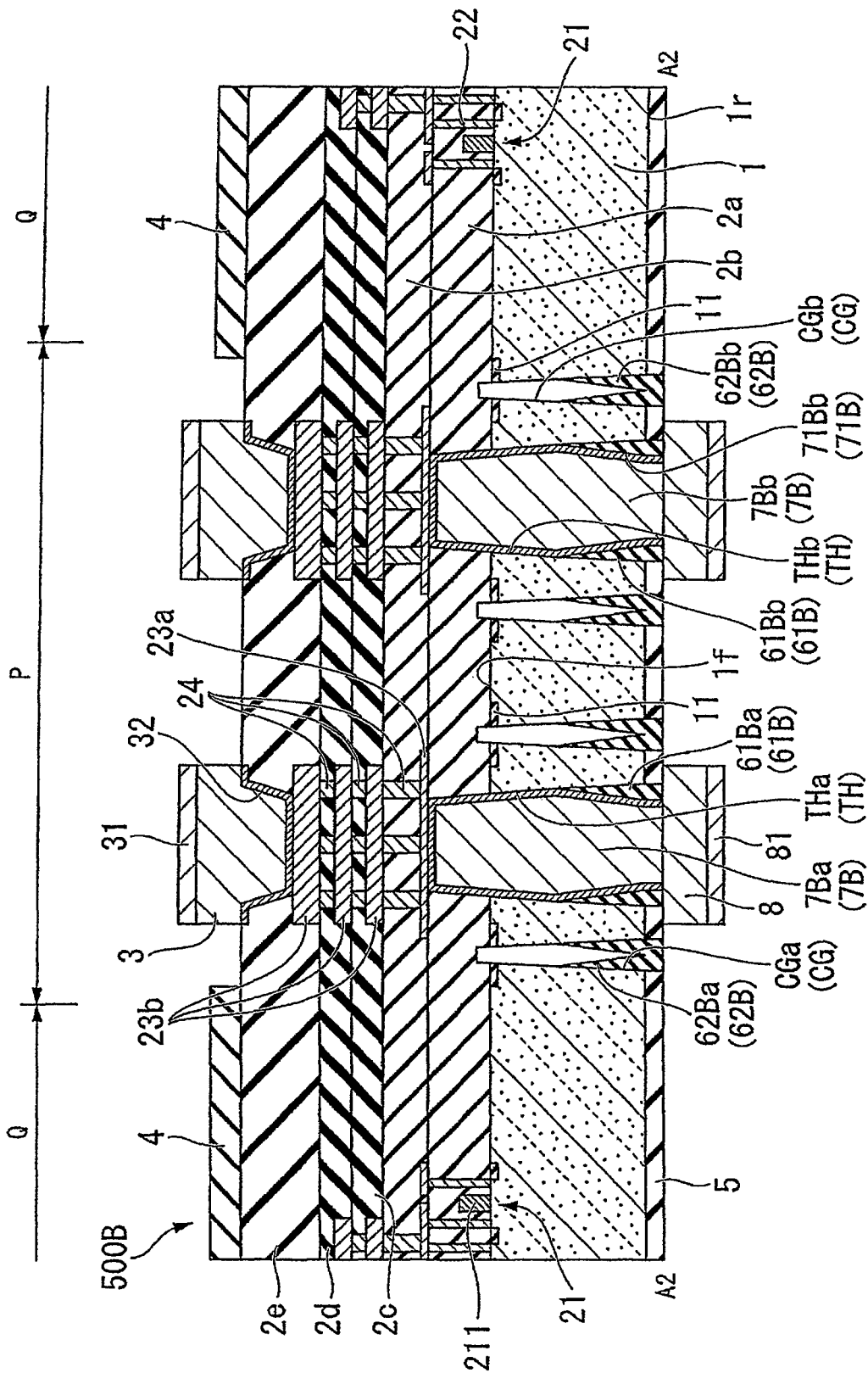
FIG. 12C is a diagram for explaining the configuration of the semiconductor device according to the second embodiment of the invention and is a cross-sectional view showing a portion indicated by the line A2-A2 shown in FIGS. 12A and 12B.

FIG. 12A is a diagram for explaining a configuration of a semiconductor device according to the second embodiment of the invention, and is a plan view showing the top surface of the semiconductor device. FIG. 12B is also a diagram for explaining the configuration of the semiconductor device according to the second embodiment of the invention, and is a plan view showing the rear surface of the semiconductor device. FIG. 12C is also a diagram for explaining the configuration of the semiconductor device according to the second embodiment of the invention, and is a cross-sectional view showing a portion indicated by the line A2-A2 in FIG. 12A and 12B. Further, FIGS. 13A to 13C, FIGS. 14A to 14C, and FIGS. 15A to 15C are diagrams for sequentially explaining processes of a manufacturing method the semiconductor device according to the second embodiment of the invention shown in FIGS. 12A to 12C, and correspond respectively to FIG. 7, FIG. 8 (FIGS. 8A and 8B) and FIG. 9 of the first embodiment. Like components to those of the semiconductor device of the first embodiment are denoted by the same reference numerals and description thereof will be omitted.

Figure 13A:
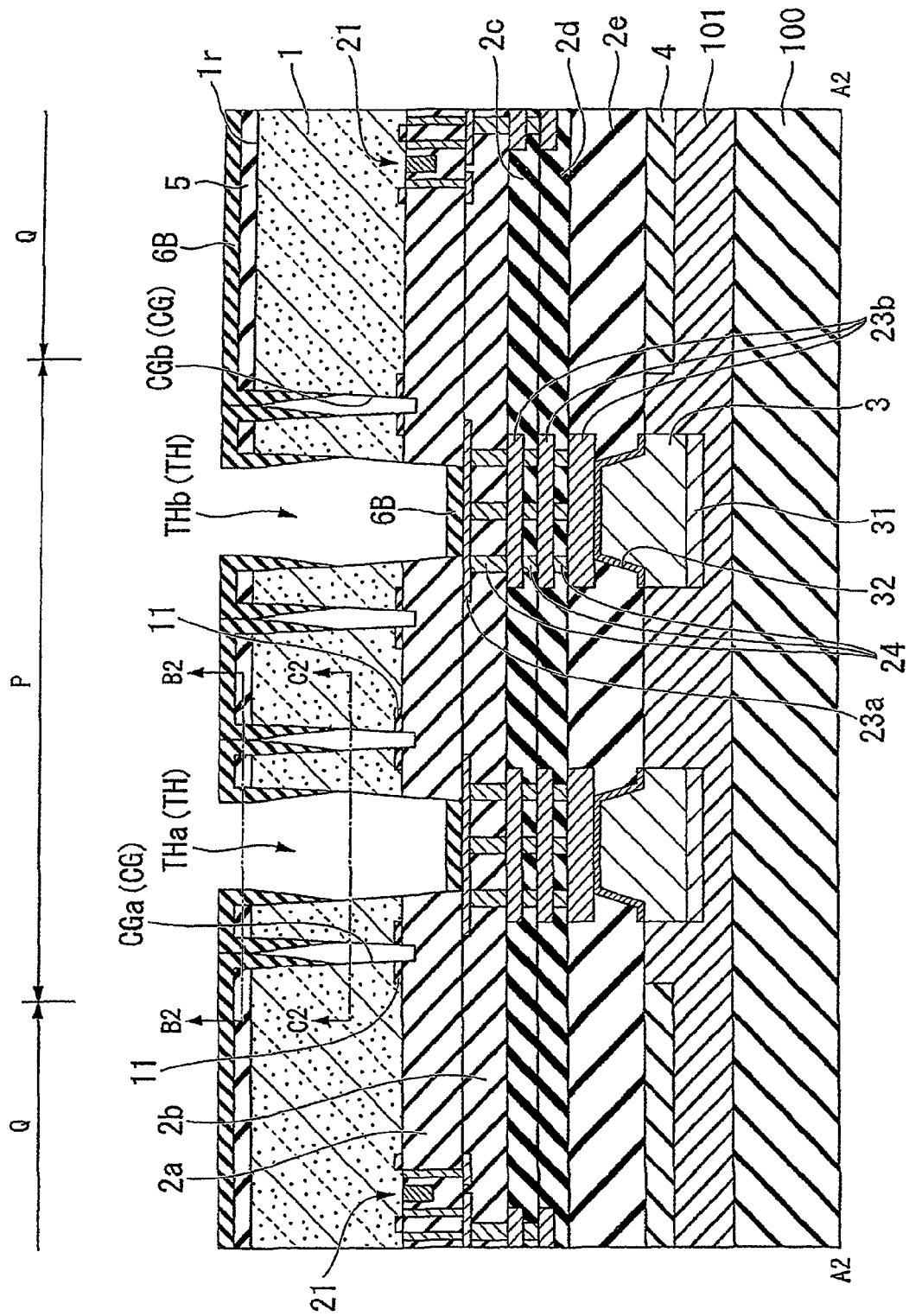
FIG. 13A is a diagram for explaining a manufacturing method of the semiconductor device according to the second embodiment of the invention and is a diagram corresponding to FIG. 7 of the first embodiment.

A semiconductor device 500B according to the second embodiment is different from the semiconductor device of the first embodiment in the following features. As shown in FIG. 13A corresponding to FIG. 7, in a process to form an insulating film over the surface of the rear surface protective film 5, in the TSV through holes TH (THa, THb) and in the insulating ring annular grooves CG (CGa, CGb), the insulating film is formed under poor coverage conditions. As a result of this, as shown in FIG. 13A, the opening of the insulating ring annular groove CG is closed while leaving an air gap in the inside thereof, before the insulating ring annular groove CG is completely filled with the insulating material. As for the TSV through hole TH, the side wall thereof is covered only partially with the insulating film. However, the insulating film is formed on the bottom of the TSV through hole TH. Consequently, the insulating film 6B is formed in the manner as shown in FIG. 13A. FIG. 13C reveals the air gap.

Figure 13B:
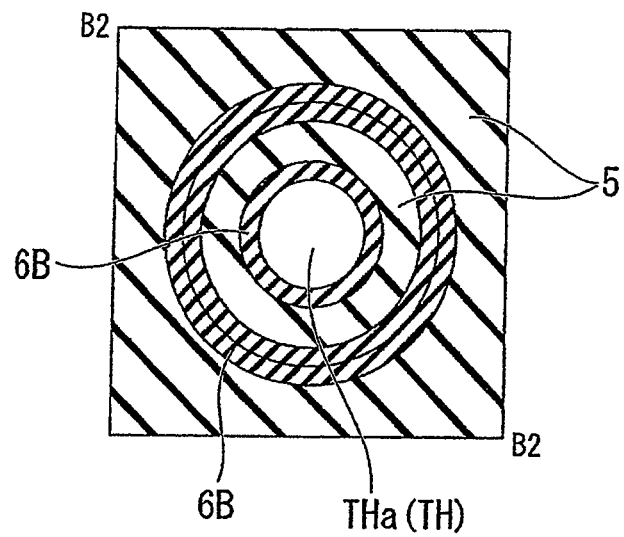
FIG. 13B is a plane cross-sectional view showing a portion indicated by the line B2-B2 in FIG. 13A.
Figure 13C:
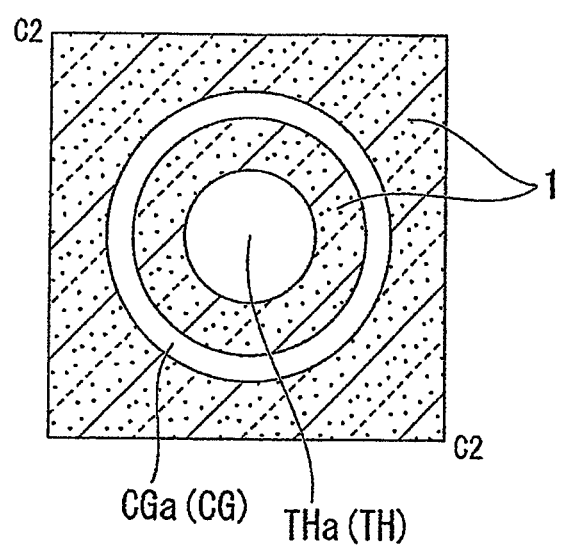
FIG. 13C is a plane cross-sectional view showing a portion indicated by the line C2-C2 in FIG. 13A.
Figure 14A:
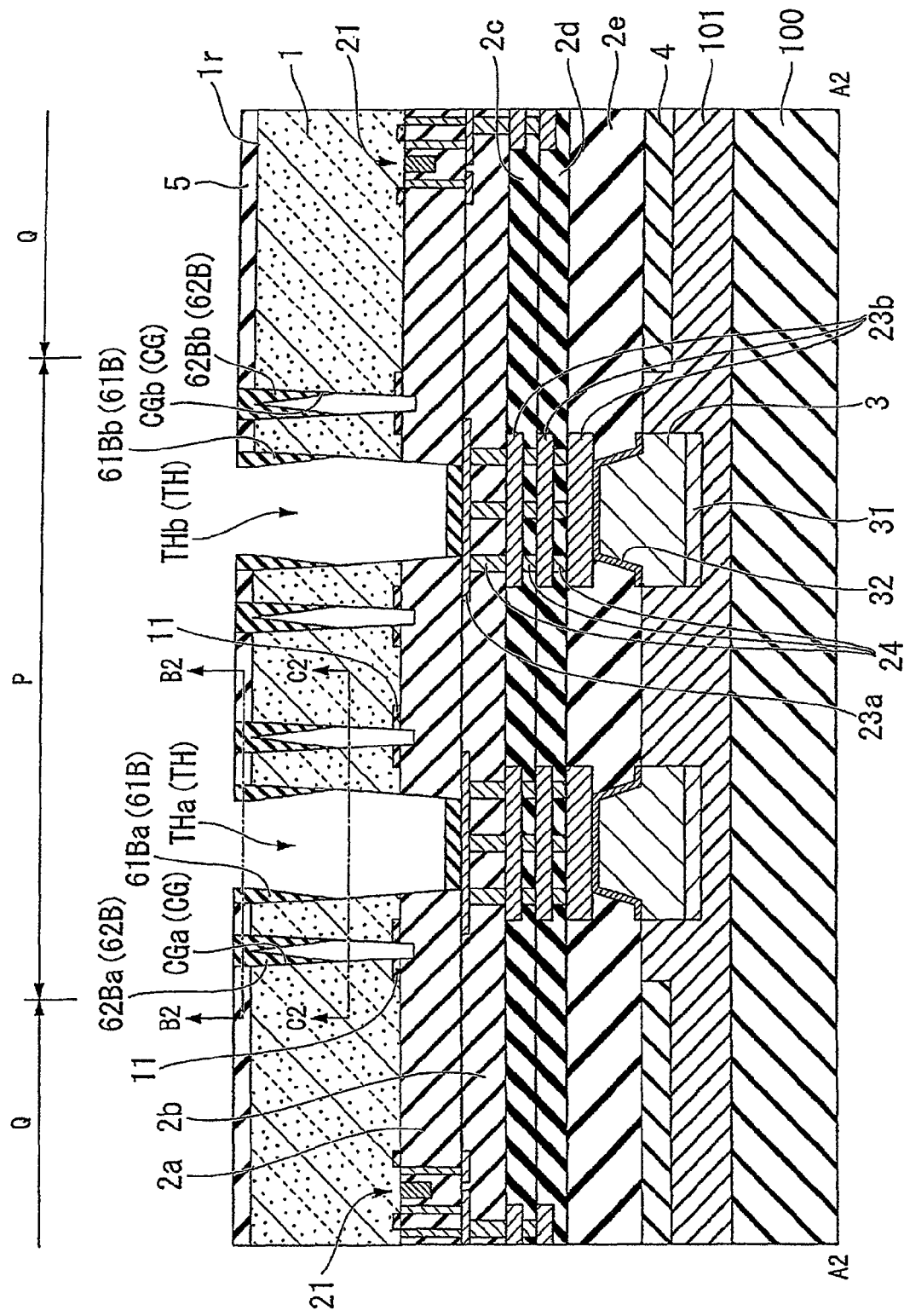
FIG. 14A is a diagram for explaining the manufacturing method of the semiconductor device according to the second embodiment of the invention and is a diagram corresponding to FIG. 8A of the first embodiment.
Figure 14B:
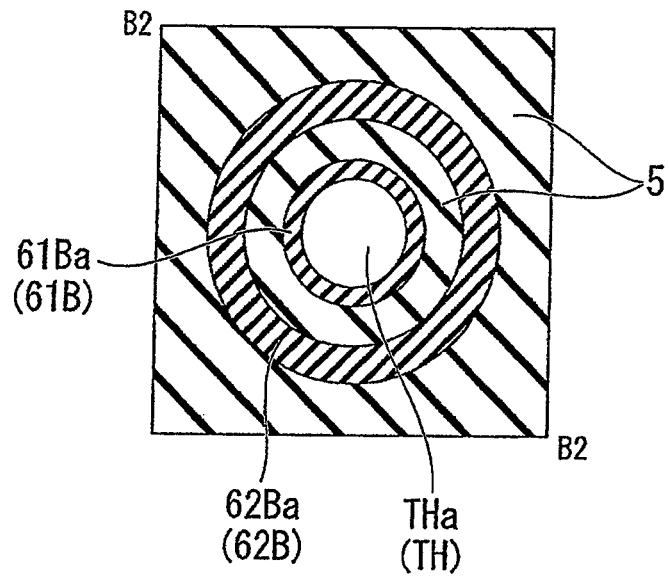
FIG. 14B is a plane cross-sectional view showing a portion indicated by the line B2-B2 in FIG. 14A.
Figure 14C:
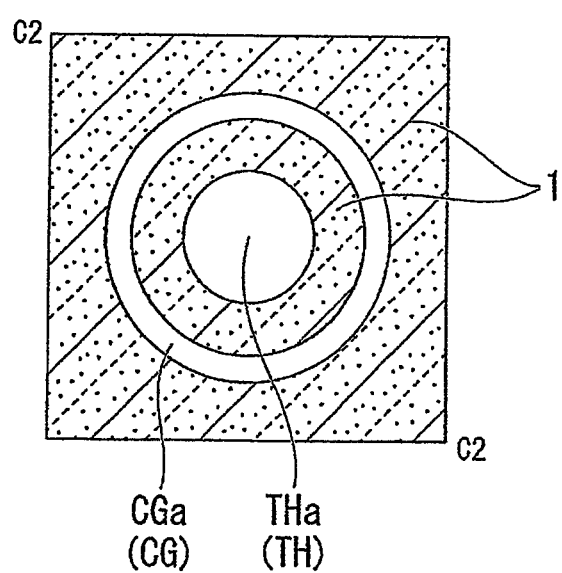
FIG. 14C is a plane cross-sectional view showing a portion indicated by the line C2-C2 in FIG. 14A.
Figure 15A:
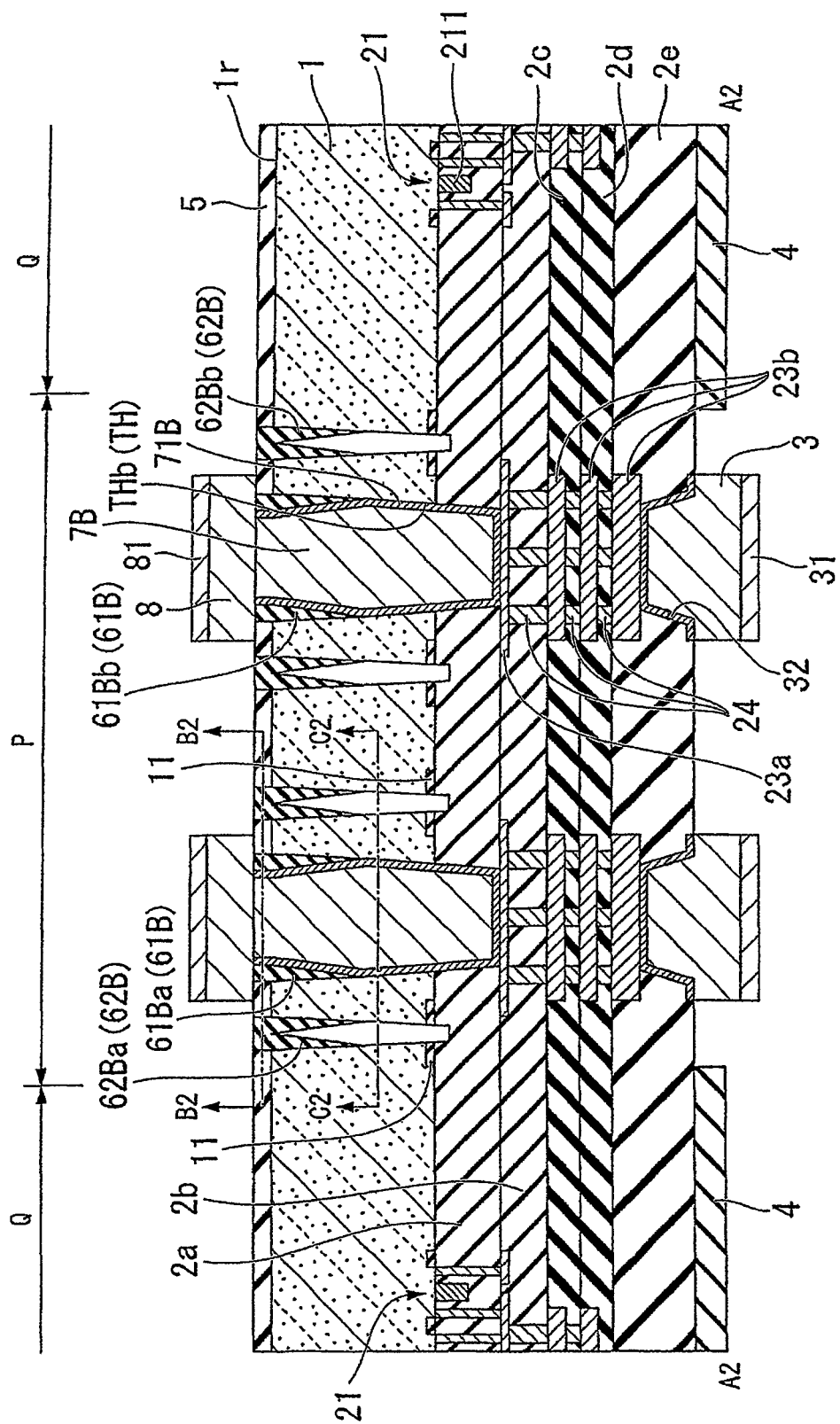
FIG. 15A is a diagram for explaining the manufacturing method of the semiconductor device according to the second embodiment of the invention and is a diagram corresponding to FIG. 9A of the first embodiment.
Figure 15B:
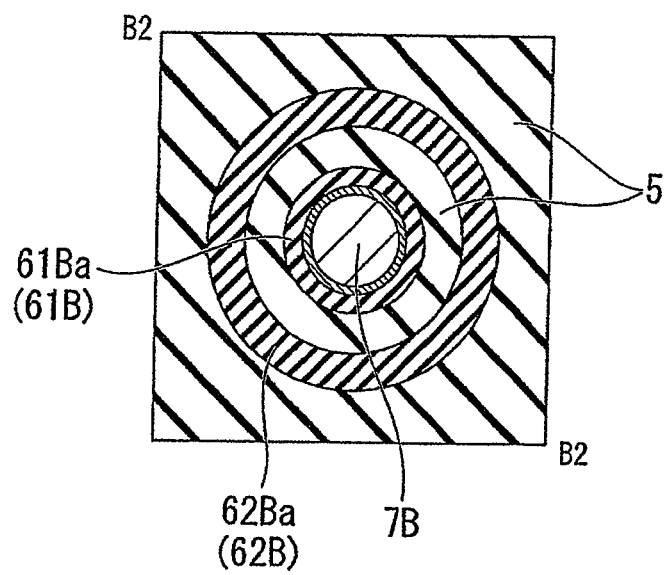
FIG. 15B is a plane cross-sectional view showing a portion indicated by the line B2-B2 shown in FIG. 15A.
Figure 15C:
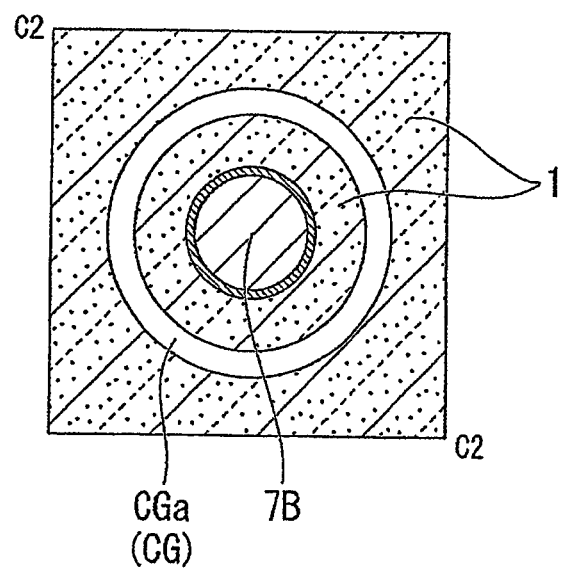
FIG. 15C is a plane cross-sectional view showing a portion indicated by the line C2-C2 shown in FIG. 15A FIG. 15A.

When the insulating film is removed by etch-back from the surface of the rear surface protective film 5 and the bottoms of the TSV through holes TH (THa, THb), in the same manner as the first embodiment shown in FIGS. 8A and 8B, the structure transitions from state shown in FIGS. 13A to 13C to the state shown in FIGS. 14A to 14C. Accordingly, a TSV side-wall insulating ring 61B (61Ba, 61Bb) is formed on the side wall of each of the TSV through holes TH, while a single insulating ring 62B (62Ba, 62Bb) is formed in each of the insulating ring annular grooves CG (CGa, CGb). FIG. 14B is a plane cross-sectional view showing a portion indicated by the line B2-B2 in FIG. 14A, FIG. 14C is a plane cross-sectional view showing a portion indicated by the line C2-C2 in FIG. 14A, and FIGS. 14B and 14C are the same as FIGS. 13B and 13C, respectively. Subsequently, as shown in FIGS. 15A-15C, a thin seed/barrier layer 71B is formed in the TSV through holes TH (THa, THb), and the TSV through holes TH are then filled with a conductive material in the same manner as in the first embodiment shown in FIGS. 9A and 9B, whereby TSVs 7B are formed. The rear surface bump electrodes 8 and the solder 81 are the same as those in the first embodiment.

Accordingly, a semiconductor device finally obtained has an air gap in each of the inside of the insulating ring annular grooves CG (CGa, CGb) as shown in FIG. 15C. The air gap has a lower dielectric constant than a normal insulating film. Therefore, this second embodiment is able to provide an advantage, in addition to those of the first embodiment, that the parasitic capacity between the adjacent TSVs 7Ba and 7Bb can be reduced further.

The manufacturing processes before those shown in FIGS. 13A to 13C are the same as the processes before those shown in FIG. 6 (FIGS. 6A and 6B) in the first embodiment.

The first and second modifications of the first embodiment shown in FIG. 10 (FIGS. 10A and 10B) and FIG. 11 (FIGS. 11A and 11B) can be applied to the second embodiment as well.

It is apparent that the present invention is not limited to the above embodiments, but may be modified and changed without departing from the scope and spirit of the invention. For example, the above embodiments have been described using an example of a semiconductor device represented by a DRAM. Nevertheless, the present invention is applicable to any other semiconductor devices. The number and size of pads arranged are not limited to the illustrated examples and may be set in any desired manner.

What is claimed is:

1. A semiconductor device comprising:
   a wiring layer formed over a first major surface of a substrate;
   a through hole penetrating a second major surface facing the first major surface of the substrate and reaching the wiring layer;
   an annular groove formed in an annular shape in the second major surface so as to surround the through hole without reaching the wiring layer;
   a first annular insulating portion including an insulating material embedded in the annular groove;
   a second annular insulating portion including an insulating film covering a side wall of the through hole; and
   a conductor filling an inside of the insulating film and being in contact with the wiring layer.

2. The semiconductor device according to claim 1, wherein the second annular insulating portion has a thickness that is smaller than the thickness of the first annular insulating portion.

3. The semiconductor device according to claim 1, wherein the through hole and the annular groove are formed such that their cross-sectional areas become gradually smaller from the second major surface toward the first major surface.

4. The semiconductor device according to claim 1, further comprising an interlayer insulating film stacked on the first major surface,
   wherein the wiring layer is formed on the interlayer insulating film.

5. The semiconductor device according to claim 4, wherein a shallow trench isolation structure is arranged in a portion located between the substrate and the interlayer insulating film and corresponding to the annular groove.

6. The semiconductor device according to claim 5, wherein the annular groove penetrates through the substrate to reach the interlayer insulating film.

7. The semiconductor device according to claim 1, wherein the insulating material and the insulating film are formed of the same material.

8. The semiconductor device according to claim 7, wherein the insulating material includes at least one of silicon oxide and silicon nitride, or a stacked film thereof.

9. The semiconductor device according to claim 1, wherein the insulating material closes an upper part of the annular groove and the annular groove has an air gap in the inside thereof.

10. The semiconductor device according to claim 1, wherein the annular groove is provided in plurality, the annular grooves have different diameters and are arranged substantially concentrically.

11. The semiconductor device according to claim 1, wherein the annular groove is provided in singularity, and the thickness of the second annular insulating portion is substantially a half of the thickness of the first annular insulating portion.

12. The semiconductor device according to claim 1, wherein the conductor contains at least copper.

13. The semiconductor device according to claim 1, further comprising a barrier layer provided between the insulating film and the conductor, wherein the barrier layer includes at least one of titanium, titanium nitride, tantalum and tantalum nitride, or a stacked film thereof.

14. The semiconductor device according to claim 1, wherein the insulating film covers a part of the side wall of the through hole.

15. The semiconductor device according to claim 1, further comprising a protective film on the second major surface of the substrate, wherein the through hole and the annular groove are provided to penetrate through the protective film.

16. The semiconductor device according to claim 15, wherein the protective film comprises a silicon nitride film.

17. The semiconductor device according to claim 1, further comprising a bump electrode in contact with the conductor, and the second annular insulating portion.

18. The semiconductor device according to claim 15, further comprising a bump electrode in contact with the conductor, the second annular insulating portion, and the protective film.

19. A semiconductor device comprising:
   a wiring layer formed over a first major surface of a substrate;
   an insulating film formed on a side wall of a through hole penetrating a second major surface facing the first major surface of the substrate and reaching the wiring layer;
   a conductor connected to the wiring layer and arranged in the through hole with the insulating film interposed; and
   an annular insulating portion arranged to surround the conductor with an intervention of the substrate without reaching the wiring layer.

20. The semiconductor device according to claim 19, wherein the annular insulating portion is provided to penetrate through an element isolation region arranged in the substrate.

* * * * *